US010707230B2

(12) United States Patent
Rabkin et al.

(10) Patent No.: US 10,707,230 B2
(45) Date of Patent: Jul. 7, 2020

(54) THREE-DIMENSIONAL MEMORY DEVICE INCLUDING LINER FREE MOLYBDENUM WORD LINES AND METHODS OF MAKING THE SAME

(71) Applicant: SANDISK TECHNOLOGIES LLC, Addison, TX (US)

(72) Inventors: Peter Rabkin, Cupertino, CA (US); Raghuveer S. Makala, Campbell, CA (US); Masaaki Higashitani, Cupertino, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/142,752

(22) Filed: Sep. 26, 2018

(65) Prior Publication Data
US 2020/0051993 A1 Feb. 13, 2020

Related U.S. Application Data

(60) Provisional application No. 62/718,013, filed on Aug. 13, 2018.

(51) Int. Cl.
*H01L 29/76* (2006.01)
*H01L 27/11582* (2017.01)
(Continued)

(52) U.S. Cl.
CPC ...... *H01L 27/11582* (2013.01); *H01L 21/022* (2013.01); *H01L 21/02164* (2013.01);
(Continued)

(58) Field of Classification Search
CPC ........ H01L 21/02164; H01L 21/02178; H01L 21/02189; H01L 21/02192; H01L 21/022; H01L 21/76831; H01L 21/76832; H01L 21/76877; H01L 23/5226; H01L 23/5283; H01L 23/53266; H01L 27/11524; H01L 27/11529; H01L 27/11556;
(Continued)

(56) References Cited

U.S. PATENT DOCUMENTS 5,915,167 A 6/1999 Leedy
7,215,566 B2 5/2007 Kanegae
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Brook Kebede
(74) *Attorney, Agent, or Firm* — The Marbury Law Group PLLC

(57) ABSTRACT

A three-dimensional memory device includes an alternating stack of insulating layers and electrically conductive layers containing molybdenum portions located over a substrate, memory stack structures extending through the alternating stack, and including a memory film and a vertical semiconductor channel, and a backside blocking dielectric layer of a dielectric oxide material including aluminum atoms and at least one of lanthanum or zirconium atoms which directly contacts the molybdenum portions.

18 Claims, 28 Drawing Sheets

(51) Int. Cl.
  *H01L 21/768* (2006.01)
  *H01L 27/11556* (2017.01)
  *H01L 27/11529* (2017.01)
  *H01L 27/1157* (2017.01)
  *H01L 27/11573* (2017.01)
  *H01L 23/522* (2006.01)
  *H01L 23/532* (2006.01)
  *H01L 21/02* (2006.01)
  *H01L 27/11524* (2017.01)
  *H01L 21/28* (2006.01)

(52) U.S. Cl.
  CPC .. *H01L 21/02178* (2013.01); *H01L 21/02189* (2013.01); *H01L 21/02192* (2013.01); *H01L 21/76831* (2013.01); *H01L 21/76832* (2013.01); *H01L 21/76877* (2013.01); *H01L 23/5226* (2013.01); *H01L 23/53266* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 29/40114* (2019.08); *H01L 29/40117* (2019.08)

(58) Field of Classification Search
  CPC ........... H01L 27/11565; H01L 27/1157; H01L 27/11573; H01L 27/11575; H01L 27/11582; H01L 29/40114; H01L 29/40117
  USPC ........................... 438/257–260; 257/314–322
  See application file for complete search history.

(56) References Cited

U.S. PATENT DOCUMENTS

| | | | |
|---|---|---|---|
| 7,630,722 B2 | 12/2009 | Xiong et al. | |
| 7,737,415 B2 | 6/2010 | Casale et al. | |
| 7,821,748 B2 | 10/2010 | Fukuzawa et al. | |
| 8,033,090 B2 | 10/2011 | Birlem | |
| 8,130,477 B2 | 3/2012 | Fukuzawa et al. | |
| 8,237,213 B2 | 8/2012 | Liu | |
| 8,305,716 B2 | 11/2012 | Fukuzawa et al. | |
| 8,305,794 B2 | 11/2012 | Cario et al. | |
| 8,349,681 B2 | 1/2013 | Alsmeier et al. | |
| 8,436,417 B2 | 5/2013 | Shimizu et al. | |
| 8,442,551 B2 | 5/2013 | Liu | |
| 8,593,862 B2 | 11/2013 | Ranjan et al. | |
| 8,655,311 B2 | 2/2014 | Shaw | |
| 8,813,325 B2 | 8/2014 | Ramani et al. | |
| 8,815,027 B2 | 8/2014 | Ishida et al. | |
| 8,816,318 B2 | 8/2014 | Kubo | |
| 8,835,310 B2 | 9/2014 | Barabash et al. | |
| 8,836,002 B2 | 9/2014 | Ramani et al. | |
| 8,883,611 B2 | 11/2014 | Lee et al. | |
| 8,907,314 B2 | 12/2014 | Barabash et al. | |
| 8,924,544 B2 | 12/2014 | Bhat | |
| 8,934,863 B2 | 1/2015 | Shaw | |
| 8,941,197 B2 | 1/2015 | Kajiyama et al. | |
| 9,099,642 B2 | 8/2015 | Ohmori et al. | |
| 9,152,636 B2 | 10/2015 | Tseng et al. | |
| 9,257,635 B2 | 2/2016 | Ohmori et al. | |
| 9,263,666 B2 | 2/2016 | Kajiyama et al. | |
| 9,269,902 B2 | 2/2016 | Wang | |
| 9,450,184 B2 | 9/2016 | Yew et al. | |
| 9,529,714 B2 | 12/2016 | Kim et al. | |
| 9,543,515 B2 | 1/2017 | Gealy et al. | |
| 9,634,247 B2 | 4/2017 | Chen et al. | |
| 9,716,226 B2 | 7/2017 | Gealy et al. | |
| 9,780,111 B2 | 10/2017 | Ishizaki et al. | |
| 9,780,182 B2 | 10/2017 | Peri et al. | |
| 9,793,319 B2 | 10/2017 | Gan et al. | |
| 9,947,863 B2 | 4/2018 | Watanabe et al. | |
| 9,972,380 B2 | 5/2018 | Ambrose | |
| 9,984,963 B2 | 5/2018 | Peri et al. | |
| 10,032,979 B2 | 7/2018 | Gan et al. | |
| 2005/0210204 A1 | 9/2005 | Yamazaki | |
| 2006/0114714 A1 | 6/2006 | Kanegae | |
| 2006/0176401 A1 | 8/2006 | Turchetta | |
| 2006/0194591 A1 | 8/2006 | Xiong et al. | |
| 2007/0044868 A1 | 3/2007 | Yamauchi et al. | |
| 2008/0149847 A1 | 6/2008 | Casale et al. | |
| 2008/0205126 A1 | 8/2008 | Kajiyama et al. | |
| 2009/0039336 A1 | 2/2009 | Terao et al. | |
| 2009/0225634 A1 | 9/2009 | Birlem | |
| 2009/0228521 A1 | 9/2009 | Tseng et al. | |
| 2010/0096716 A1 | 4/2010 | Ranjan et al. | |
| 2010/0130239 A1 | 5/2010 | Shaw | |
| 2010/0133494 A1 | 6/2010 | Cario et al. | |
| 2010/0186069 A1 | 7/2010 | Liu | |
| 2010/0226048 A1 | 9/2010 | Fukuzawa et al. | |
| 2011/0019312 A1 | 1/2011 | Fukuzawa et al. | |
| 2011/0233655 A1 | 9/2011 | Shimizu et al. | |
| 2011/0295947 A1 | 12/2011 | Yu et al. | |
| 2013/0059422 A1 | 3/2013 | Lee et al. | |
| 2013/0071986 A1 | 3/2013 | Deweerd et al. | |
| 2013/0087074 A1 | 4/2013 | Araki et al. | |
| 2013/0154057 A1 | 6/2013 | Ramani et al. | |
| 2013/0201747 A1 | 8/2013 | Lunt et al. | |
| 2013/0248807 A1 | 9/2013 | Kubo | |
| 2014/0117298 A1 | 5/2014 | Chen et al. | |
| 2014/0137991 A1 | 5/2014 | Mitarai et al. | |
| 2014/0162615 A1 | 6/2014 | Shaw | |
| 2014/0175604 A1 | 6/2014 | Barabash et al. | |
| 2014/0183432 A1 | 7/2014 | Barabash et al. | |
| 2015/0123066 A1 | 5/2015 | Gealy et al. | |
| 2015/0137288 A1 | 5/2015 | Ohmori et al. | |
| 2015/0137290 A1 | 5/2015 | Kajiyama et al. | |
| 2015/0188043 A1 | 7/2015 | Wang | |
| 2015/0236026 A1 | 8/2015 | Lunt et al. | |
| 2015/0295169 A1 | 10/2015 | Ohmori et al. | |
| 2015/0357557 A1 | 12/2015 | Kim et al. | |
| 2016/0225866 A1* | 8/2016 | Peri | H01L 29/66833 |
| 2016/0240779 A1 | 8/2016 | Yew et al. | |
| 2016/0276412 A1 | 9/2016 | Koyama et al. | |
| 2016/0300845 A1 | 10/2016 | Ishizaki et al. | |
| 2017/0033156 A1 | 2/2017 | Gan et al. | |
| 2017/0084835 A1 | 3/2017 | Gealy et al. | |
| 2017/0263857 A1 | 9/2017 | Watanabe et al. | |
| 2018/0013061 A1 | 1/2018 | Fukumizu et al. | |
| 2018/0025775 A1 | 1/2018 | Ambrose | |
| 2018/0076384 A1 | 3/2018 | Gan et al. | |
| 2018/0197876 A1* | 7/2018 | Ge | H01L 27/11582 |

OTHER PUBLICATIONS

U.S. Appl. No. 15/804,692, filed Nov. 6, 2017, SanDisk Technologies LLC.

* cited by examiner

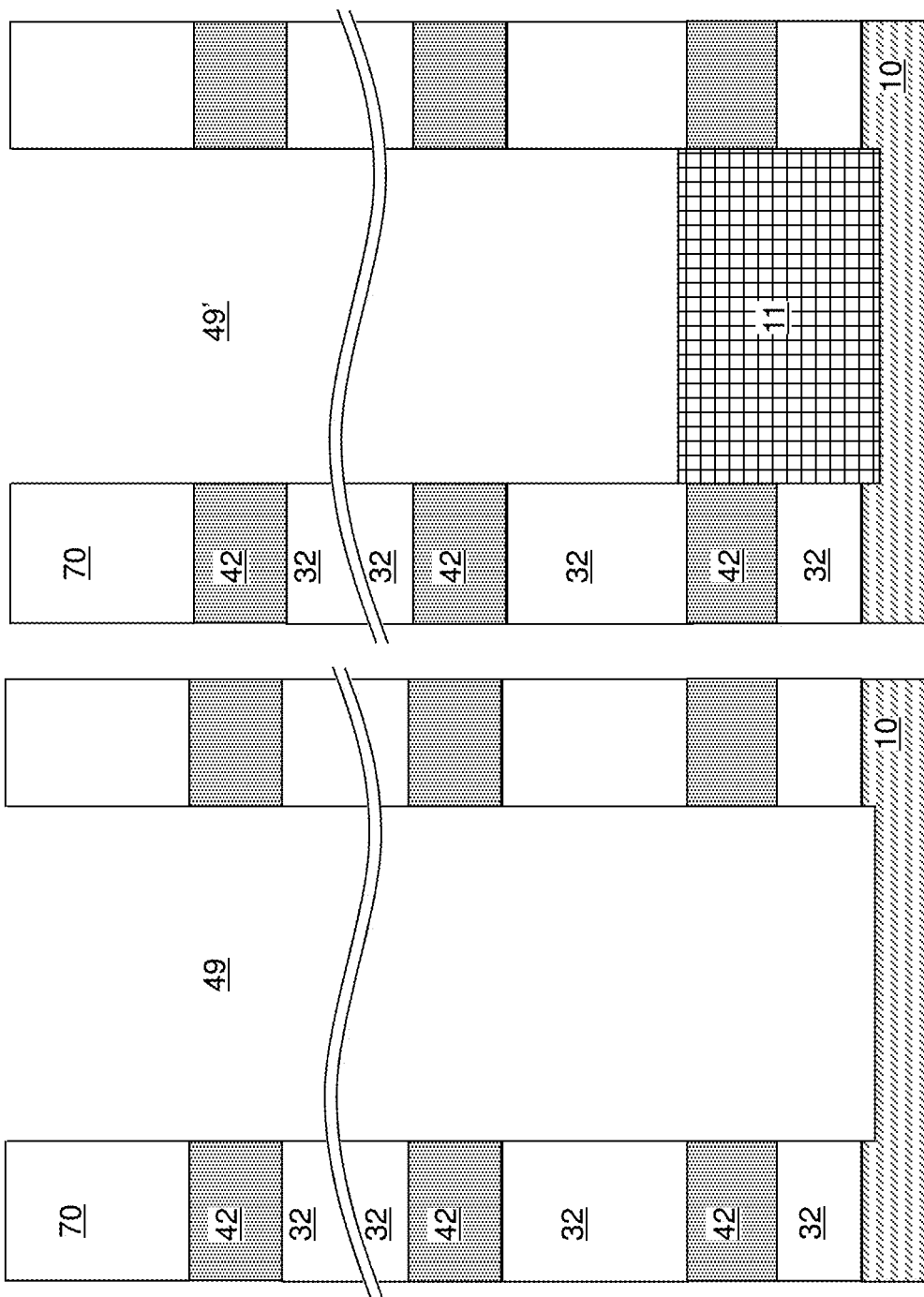

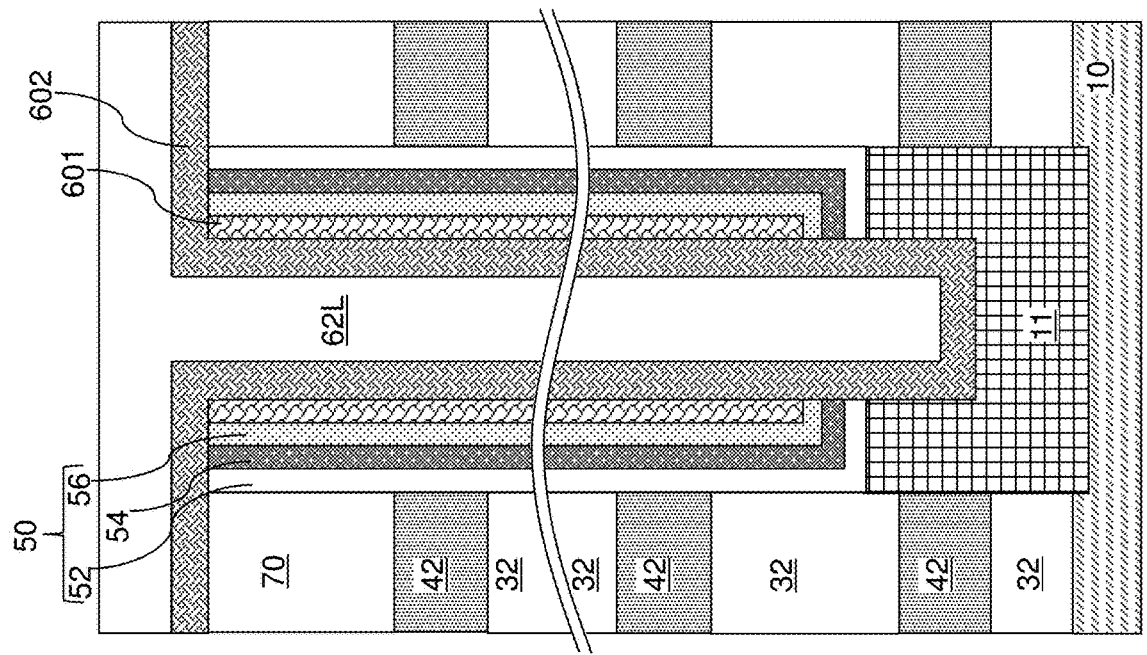
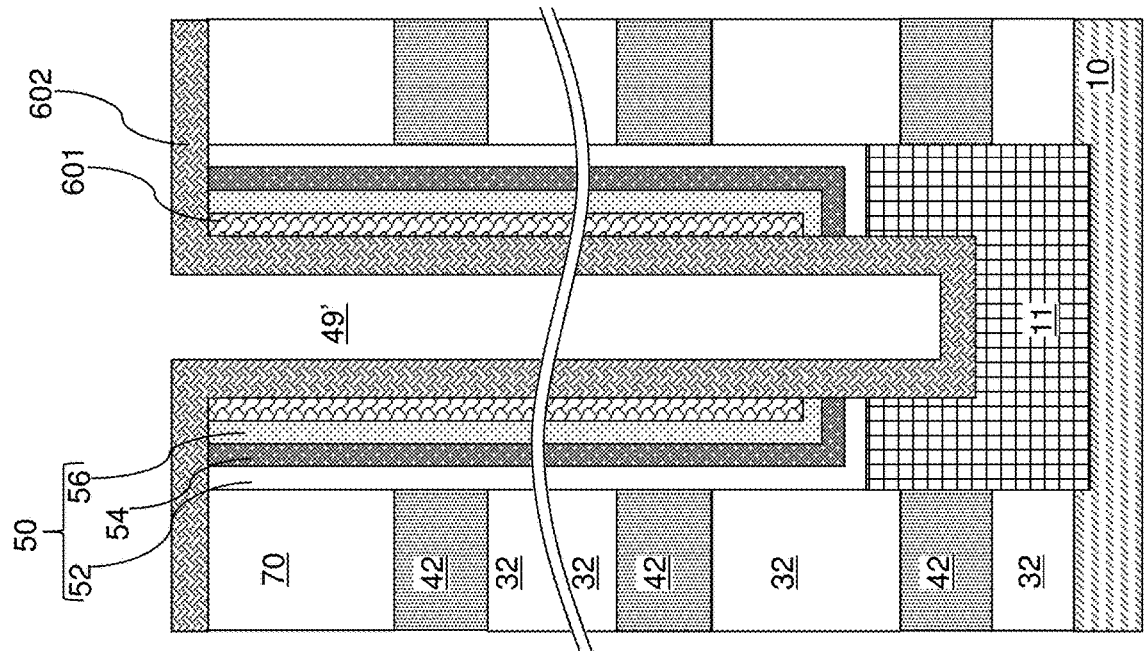

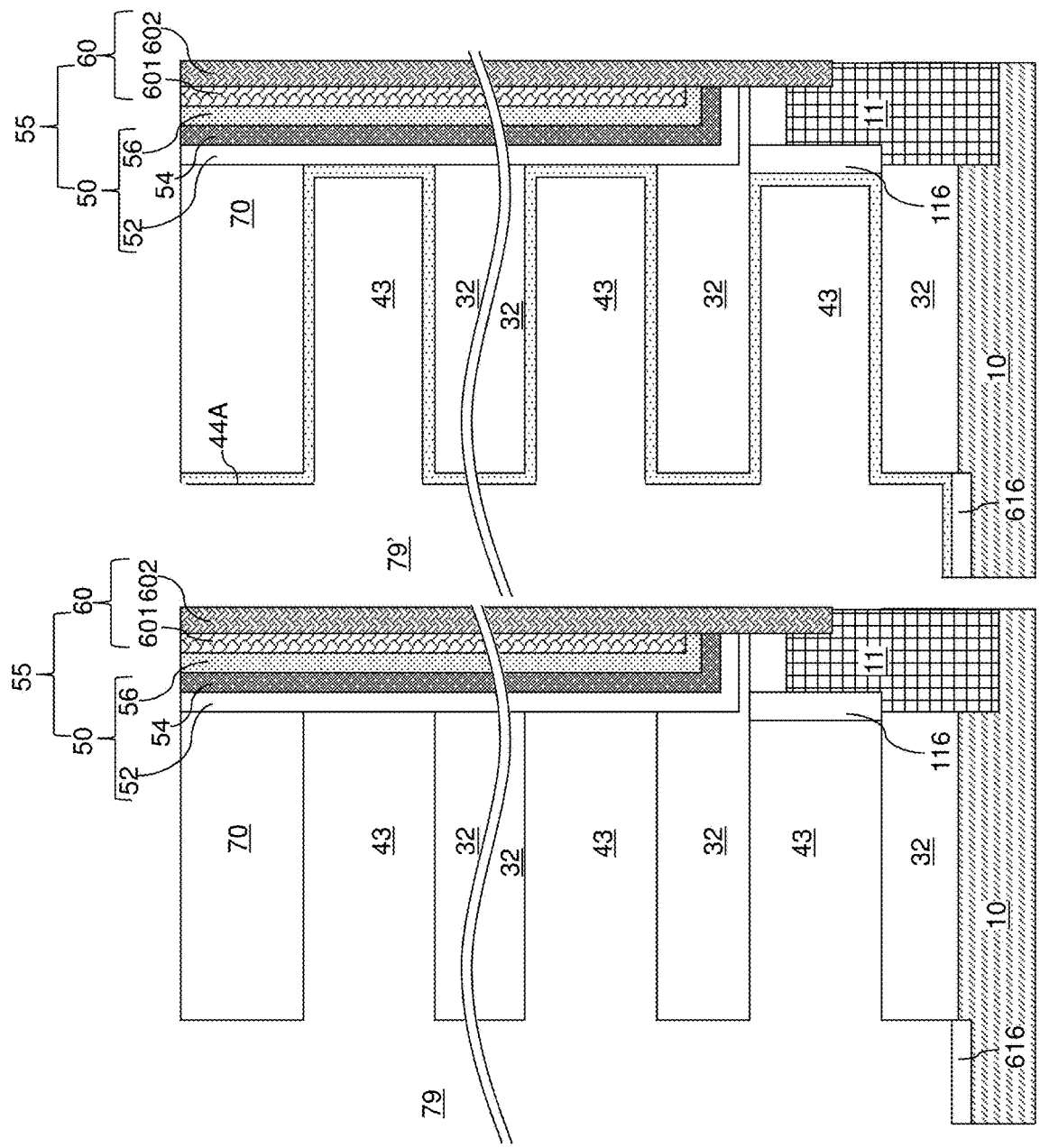

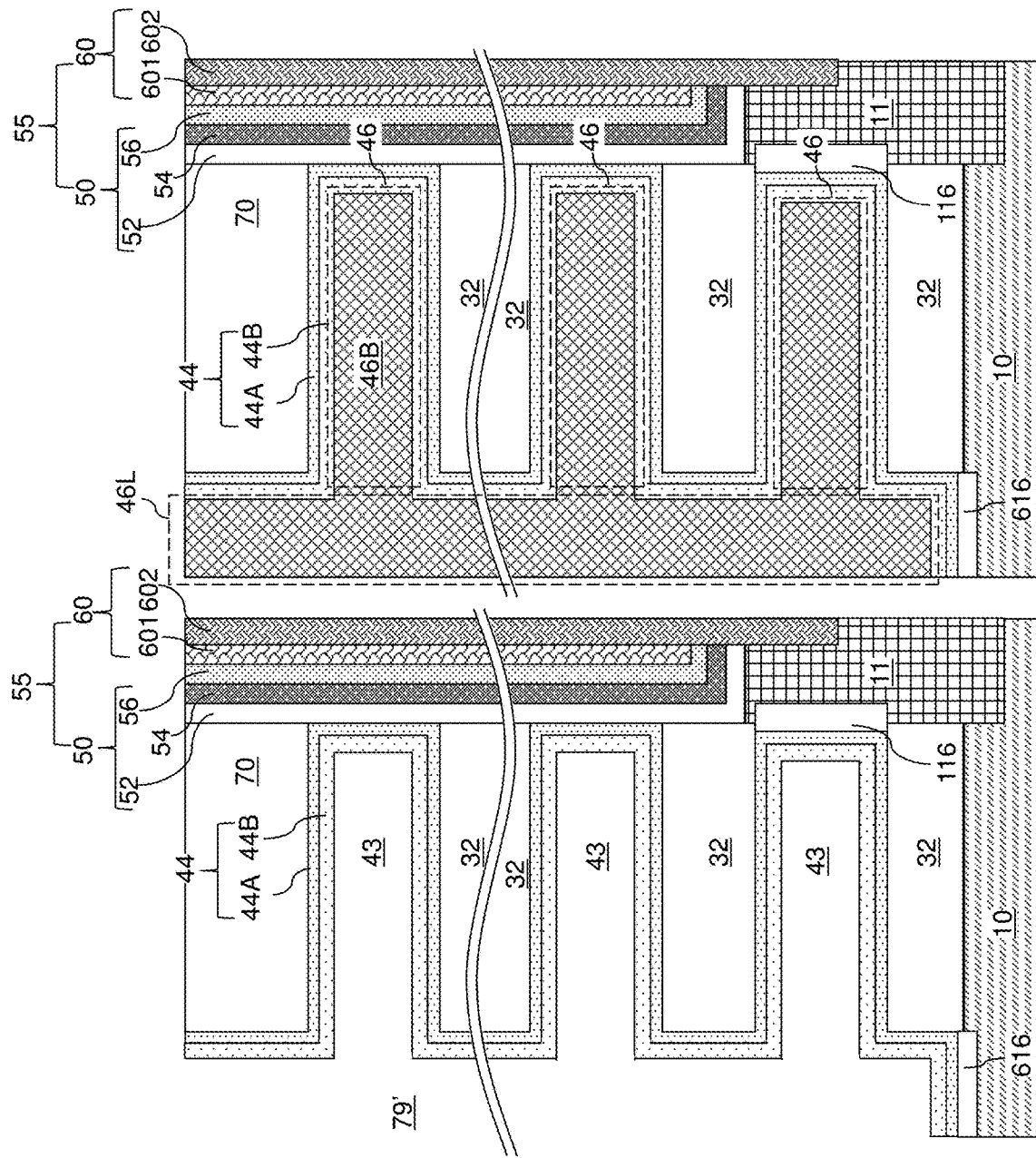

THREE-DIMENSIONAL MEMORY DEVICE INCLUDING LINER FREE MOLYBDENUM WORD LINES AND METHODS OF MAKING THE SAME

FIELD

The present disclosure relates generally to the field of semiconductor devices, and particular to a three-dimensional memory device including liner free molybdenum word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a substrate, wherein the electrically conductive layers comprise molybdenum portions, memory stack structures extending through the alternating stack, wherein each of the memory stack structures comprises a memory film and a vertical semiconductor channel, and a backside blocking dielectric layer comprising a dielectric oxide material including aluminum atoms and at least one of lanthanum or zirconium atoms, wherein the backside blocking dielectric layer is located between the electrically conductive layers and the memory stack structures and directly contacts the molybdenum portions.

According to another aspect of the present disclosure, a method of forming a three-dimensional memory device comprises forming an alternating stack of insulating layers and spacer material layers over a substrate, forming memory stack structures extending through the alternating stack, wherein each of the memory stack structures comprises a memory film and a vertical semiconductor channel, forming backside recesses by removing the sacrificial material layers selective to the insulating layers and the memory stack structures, forming a backside blocking dielectric layer comprising a dielectric oxide material including aluminum atoms and at least one of lanthanum or zirconium atoms directly on surfaces of the insulating layers and the memory stack structures in the backside recesses, and forming electrically conductive layers including molybdenum portions by depositing the molybdenum portions directly on surfaces of the backside blocking dielectric layer in remaining volumes of the backside recesses.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
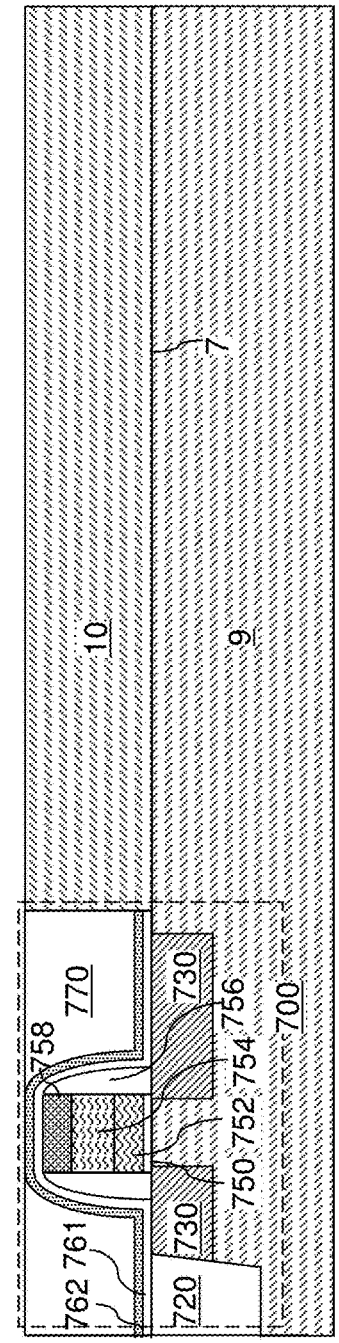
FIG. 1 is a schematic vertical cross-sectional view of an exemplary structure after formation of at least one peripheral device and a semiconductor material layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
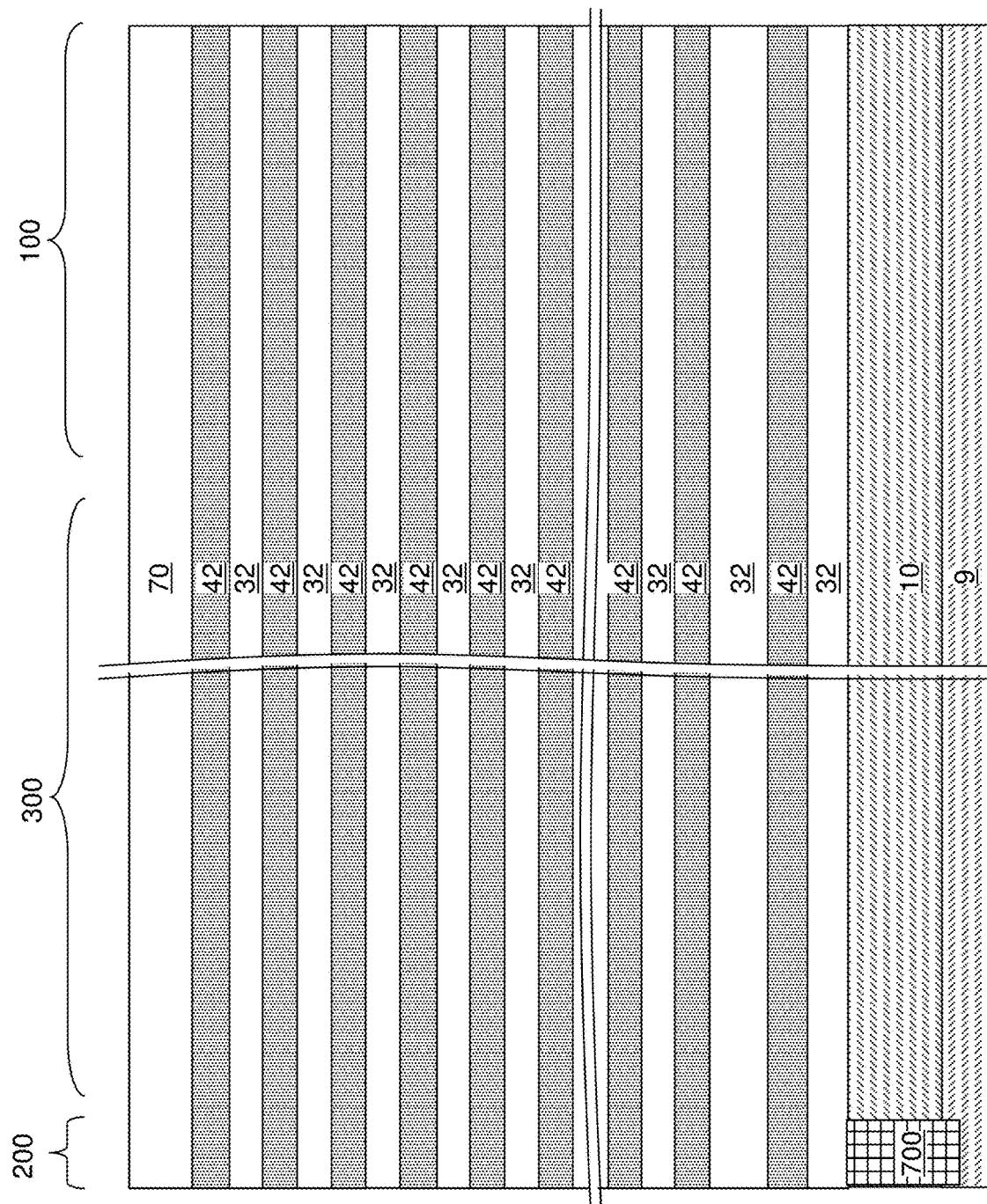
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
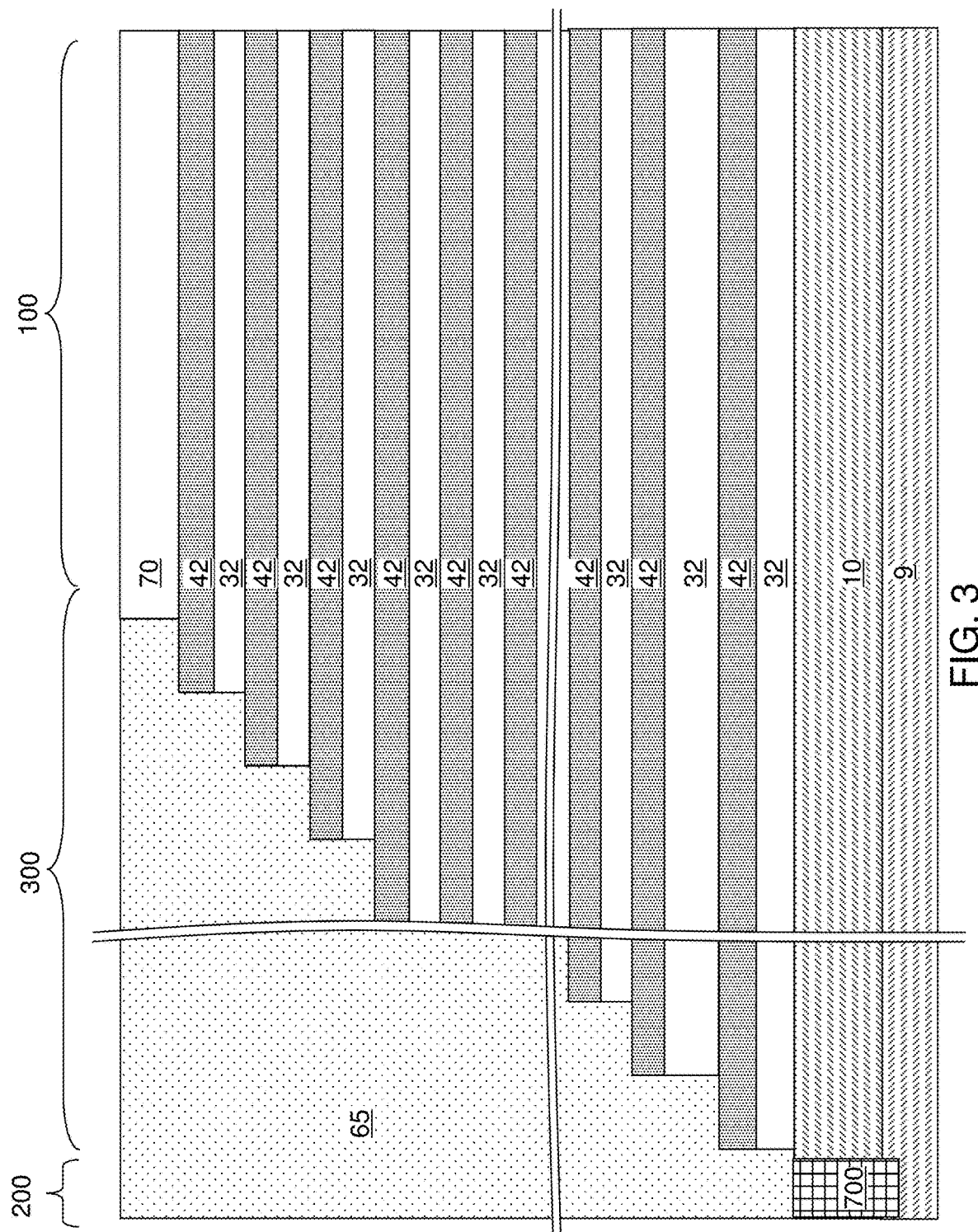
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped +dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
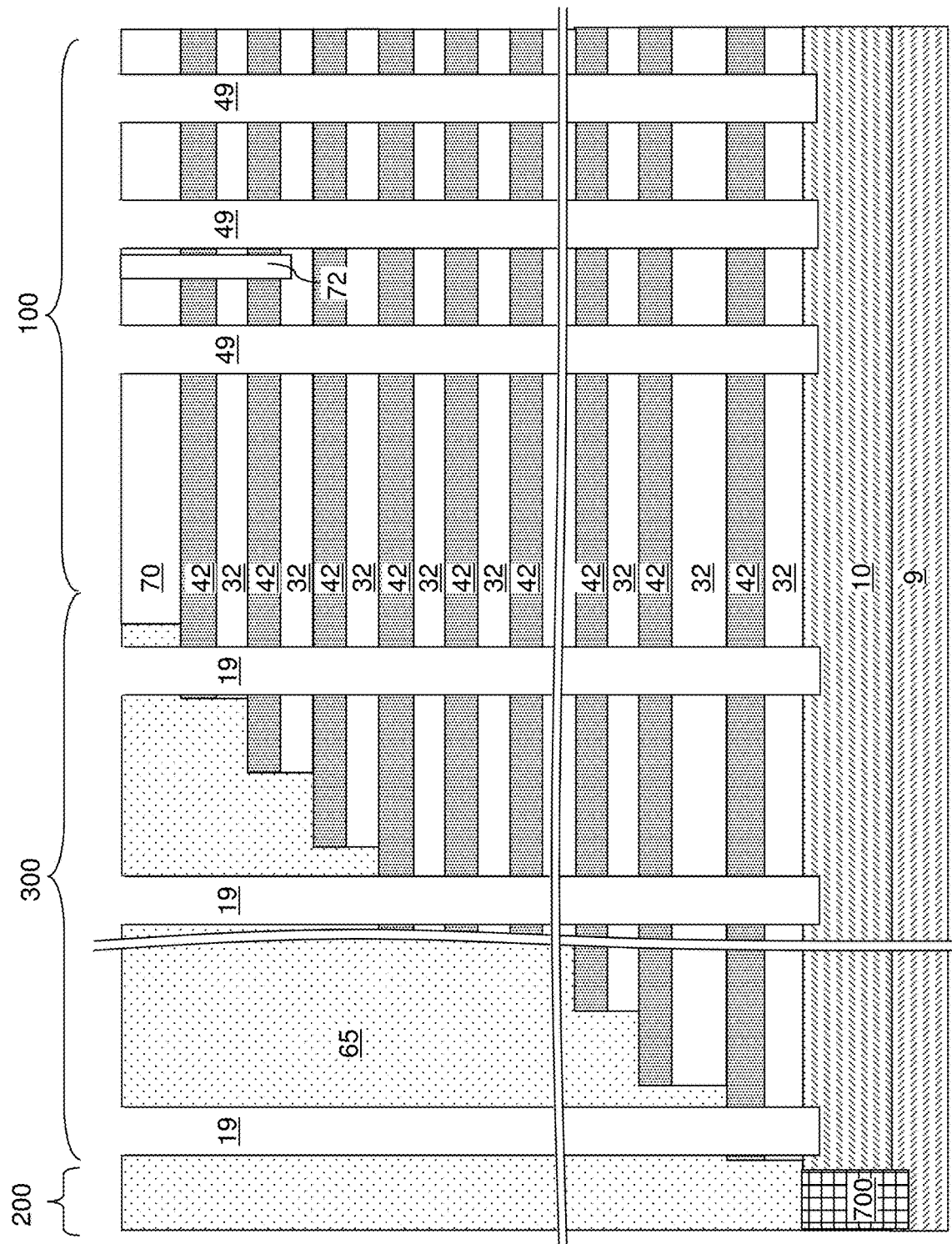
FIG. 4A is a schematic vertical cross-sectional view of the exemplary structure after formation of memory openings and support openings according to an embodiment of the present disclosure.
Figure 4B:
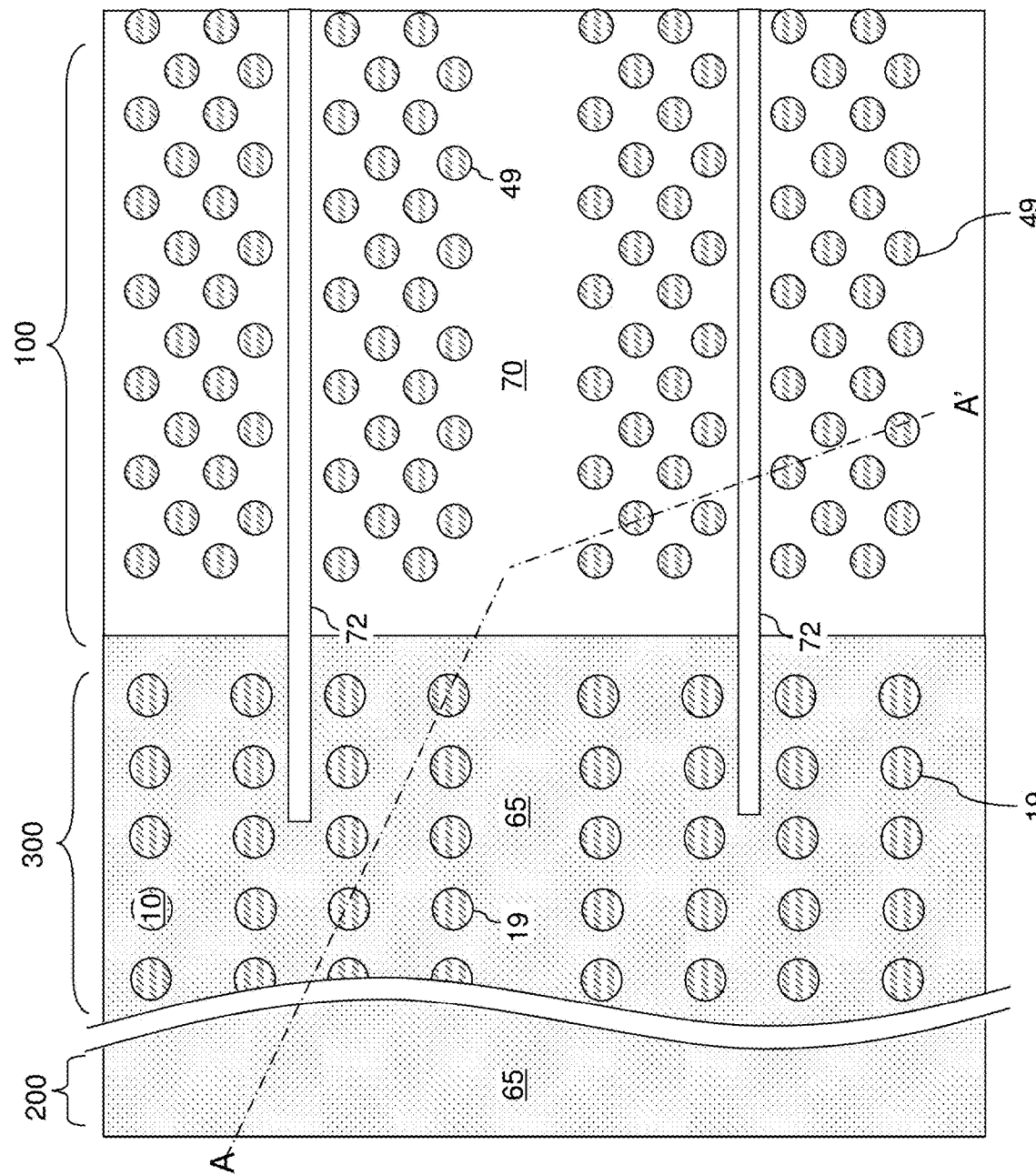
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figures 5C, 5D:
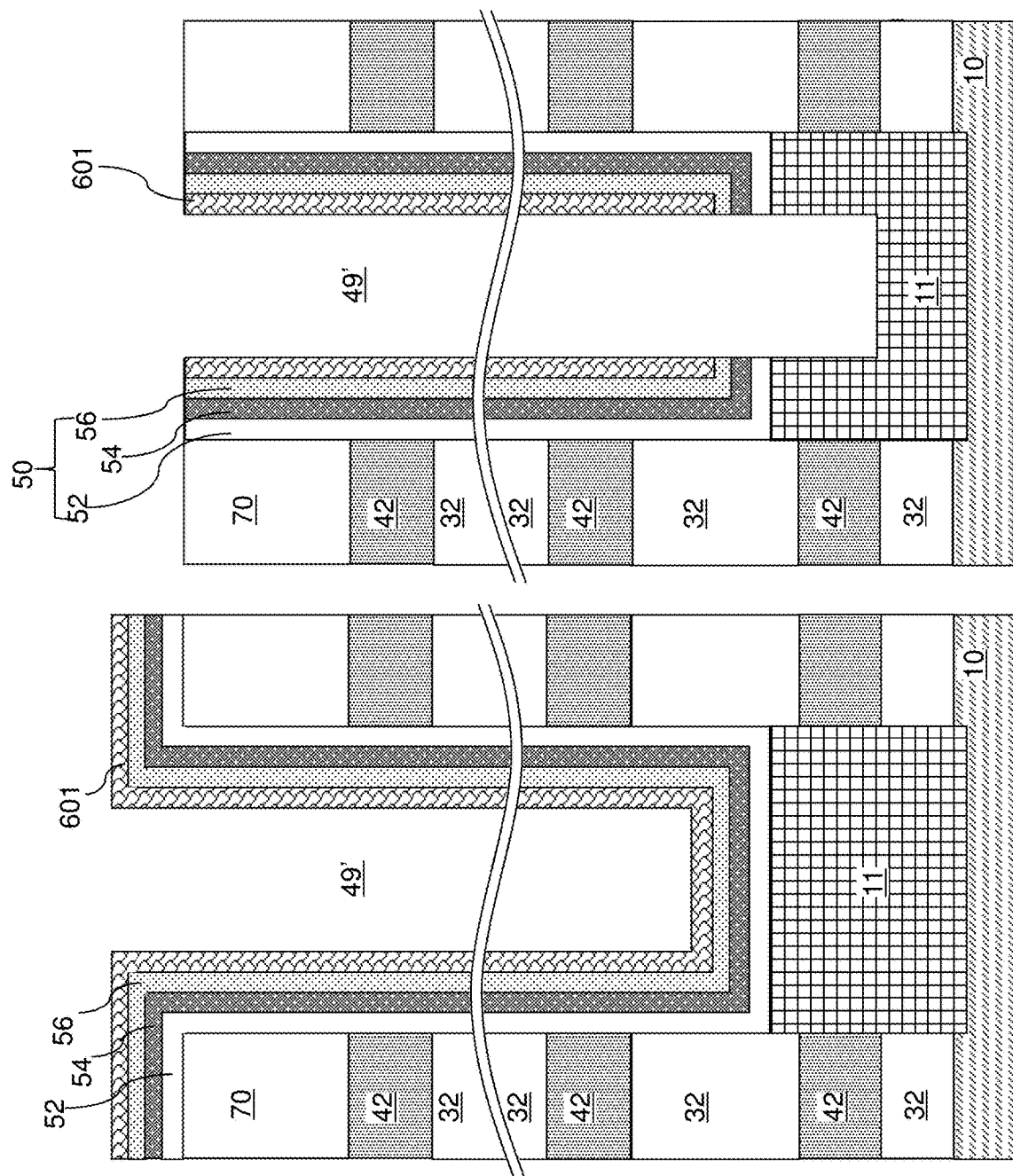

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can be a silicon oxide layer consisting essentially of silicon oxide. The blocking dielectric layer 52 can be formed by a conformal deposition method such as low pressure chemical vapor deposition, atomic layer deposition, or a combination thereof. The thickness of the blocking dielectric layer 52 can be in a range from 1 nm to 20 nm, although lesser and greater thicknesses can also be employed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (which comprise portions of the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
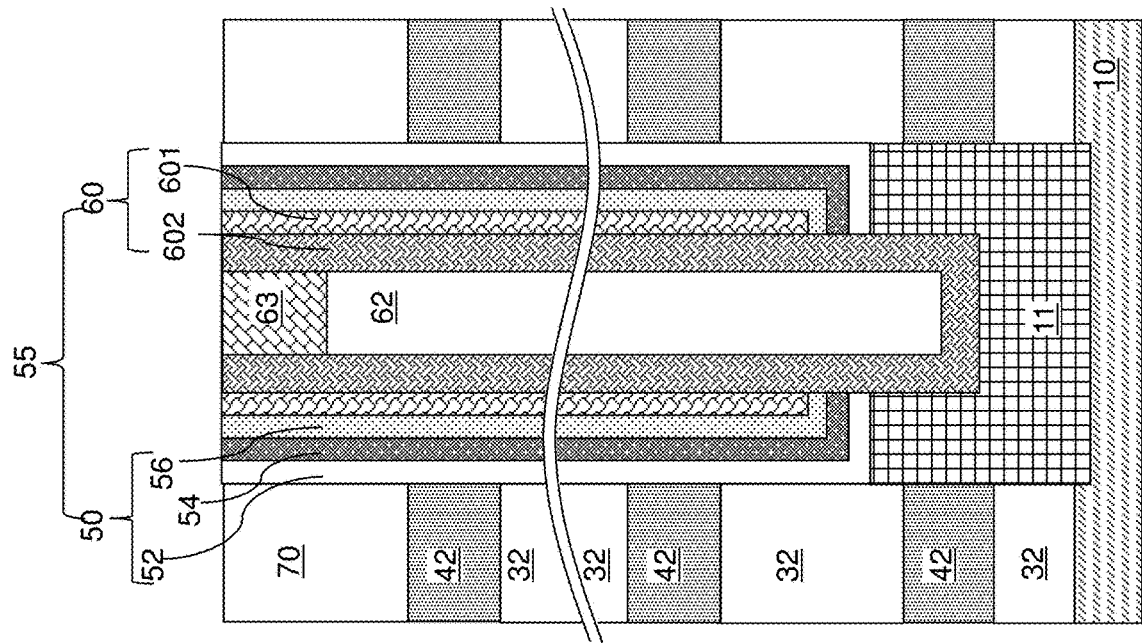

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
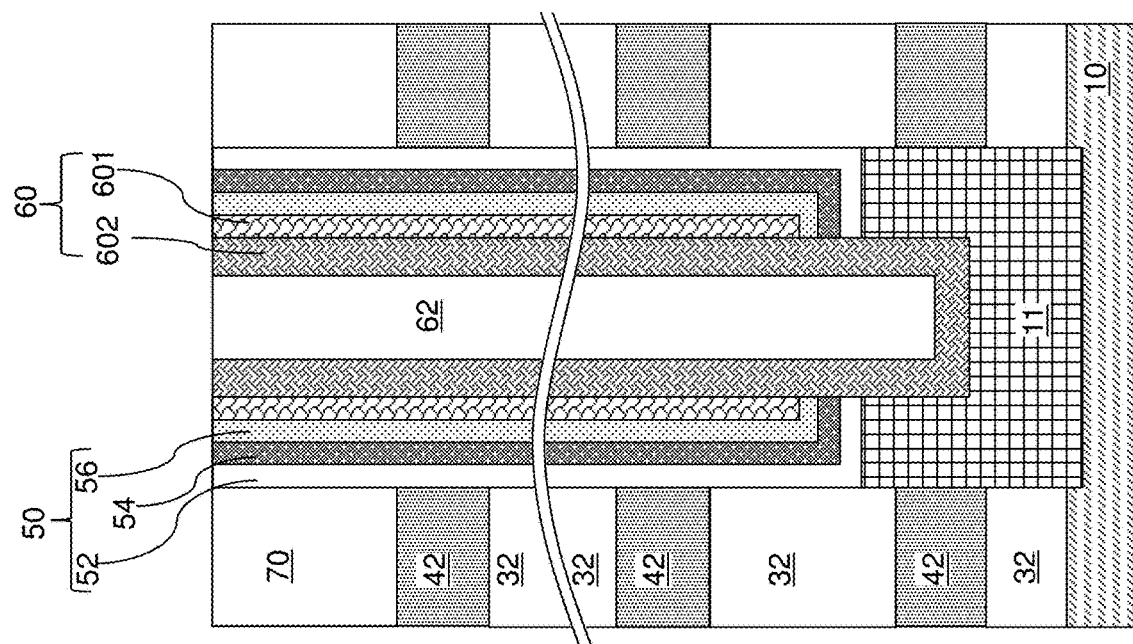

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements which comprise portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
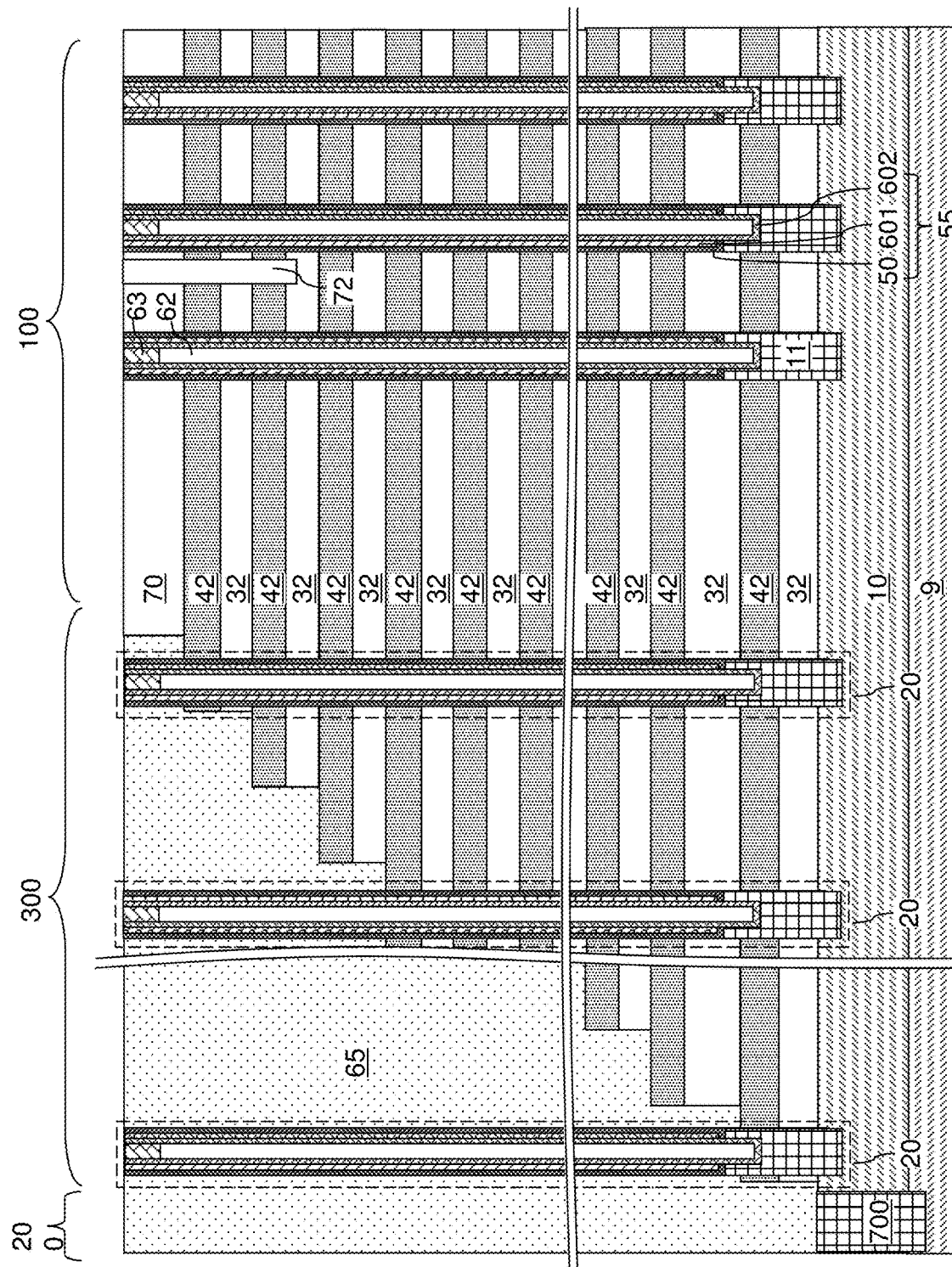
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions (e.g., portions of layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
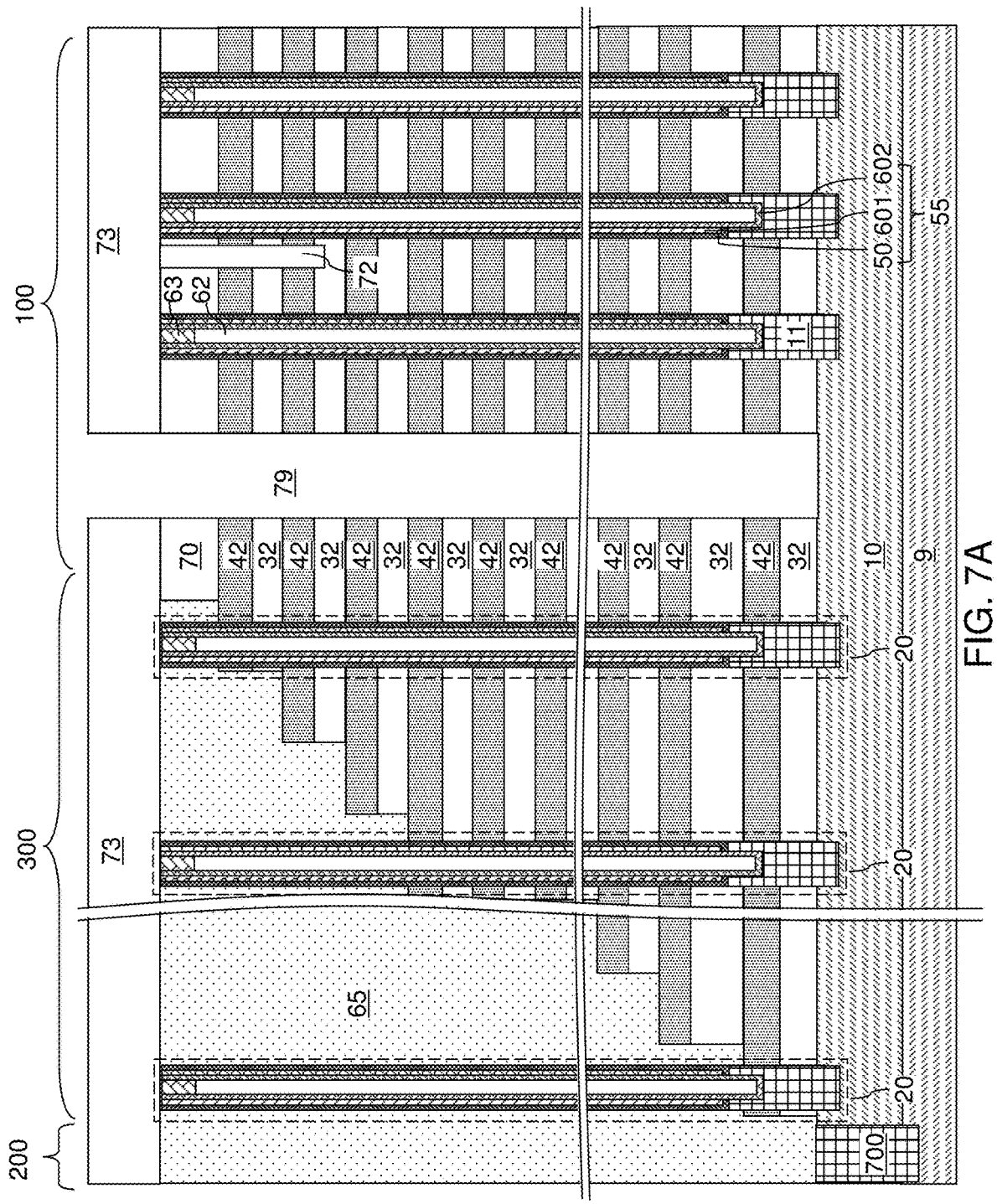
FIG. 7A is a schematic vertical cross-sectional view of the exemplary structure after formation of backside trenches according to an embodiment of the present disclosure.
Figure 7B:
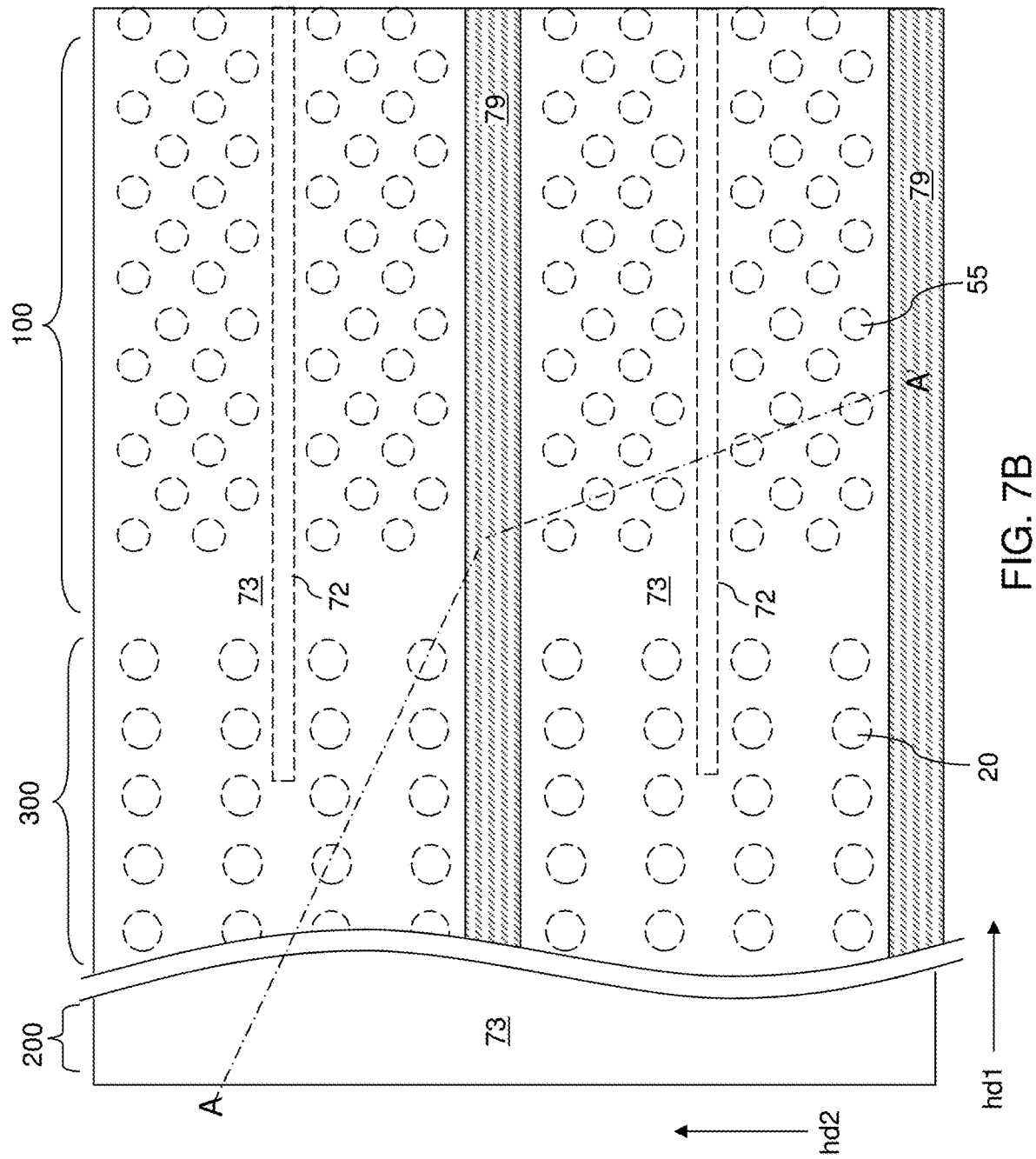
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
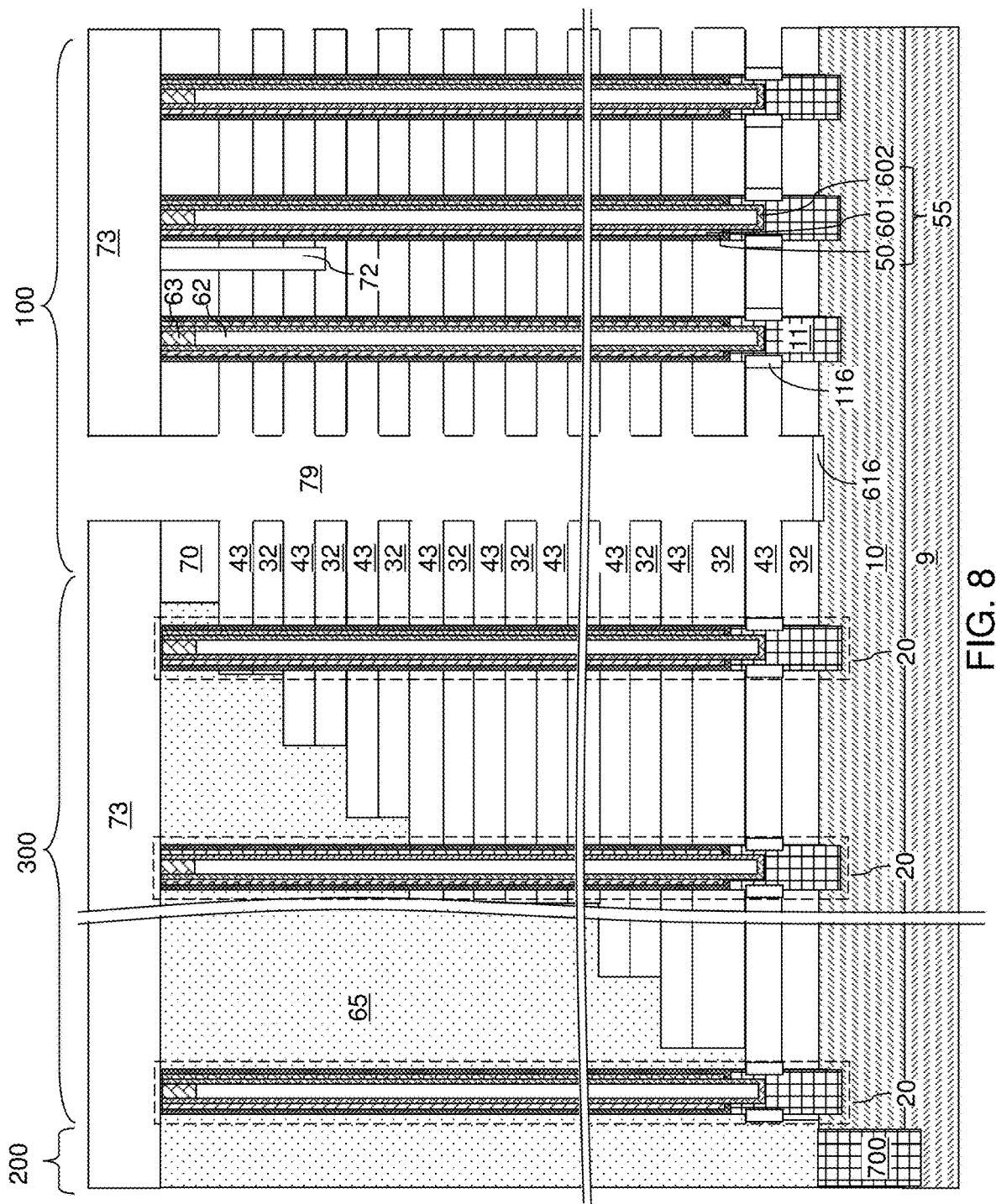
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a first backside blocking dielectric sublayer 44A can be deposited in the backside recesses 43 and on a sidewall of the backside trench 79. As used herein, the term "sublayer" is interchangeable with the term "layer" and a sublayer may comprise a portion of a layer having two or more layers or sublayers. The first backside blocking dielectric sublayer 44A can be formed directly on horizontal surfaces of the insulating layers 32 and sidewalls of the memory stack structures 55 (e.g., on the exposed parts of the front side blocking dielectric 52) within the backside recesses 43. As will be described in more detail below with respect to FIGS. 14A-14E, the first backside blocking dielectric sublayer 44A can include a dielectric metal oxide material that mitigates a dipole between aluminum oxide and the front side silicon oxide blocking dielectric layer 52. In one embodiment, the first backside blocking dielectric sublayer 44A induces a positive dipole moment therein at an interface with a silicon oxide layer such as the front side blocking dielectric layer 52. In other words, the material of the first backside blocking dielectric sublayer 44A can be selected such that the dipole moment generated at the interface between the first backside blocking dielectric sublayer 44A and the front side blocking dielectric layer 52 including silicon oxide induces positive electrical charges on the side of the front side blocking dielectric layer 52 and induces negative electrical charges on the side of the first backside blocking dielectric sublayer 44A. In one embodiment, the first backside blocking dielectric sublayer 44A can consist essentially of at least one of lanthanum oxide or zirconium oxide. In this case, the first backside blocking dielectric sublayer 44A can be a lanthanum oxide layer or a zirconium oxide layer. In one embodiment, the first backside blocking dielectric sublayer 44A can be formed by a conformal deposition process such as atomic layer deposition (ALD). The thickness of the first backside blocking dielectric sublayer 44A can be in a range from 0.5 nm to 7.5 nm, such as 1 nm to 3 nm, although lesser and greater thicknesses can also be employed.

Referring to FIG. 9C, a second backside blocking dielectric sublayer 44B can be deposited directly on the physically exposed surfaces of the first backside blocking dielectric sublayer 44A. The second backside blocking dielectric sublayer 44B can include, and can consist essentially of, aluminum oxide, which is capable of inducing a negative dipole moment therein at an interface with a silicon oxide material. In other words, a dipole moment at the interface between an aluminum oxide layer and a silicon oxide layer would induce positive electrical charges on the side of the aluminum oxide layer and induce negative electrical charges on the side of the silicon oxide layer 52. In this case, the second backside blocking dielectric sublayer 44B can be an aluminum oxide layer. In one embodiment, the second backside blocking dielectric sublayer 44B can be formed by a conformal deposition process such as atomic layer deposition (ALD). The thickness of the second backside blocking dielectric sublayer 44B can be in a range from 0.5 nm to 14 nm, such as 1 nm to 6 nm, although lesser and greater thicknesses can also be employed.

The combination of the first backside blocking dielectric sublayer 44A and the second backside blocking dielectric sublayer 44B constitutes a backside blocking dielectric layer 44. The backside blocking dielectric layer 44 is formed directly on surfaces of the insulating layers 32 and the memory stack structures 58 in the backside recesses 43. The backside blocking dielectric layer 44 comprises a dielectric oxide material including aluminum atoms and at least one of lanthanum atoms in an oxidized state and zirconium atoms in an oxidized state.

In one embodiment, each memory film 50 comprises a tunneling dielectric 56, a charge storage layer 54, and a front side silicon oxide blocking dielectric layer 52 which directly contacts the backside blocking dielectric layer 44. The backside blocking dielectric 44 includes aluminum oxide (e.g., sublayer 44B) and at least one of lanthanum oxide or zirconium oxide (e.g., sublayer 44A) which mitigates a dipole between the aluminum oxide and the front side silicon oxide blocking dielectric.

In one embodiment, the backside blocking dielectric layer 44 comprises a layer stack of an aluminum oxide layer 44B and a lanthanum oxide layer 44A. In this case, the lanthanum oxide layer 44A is formed directly on the insulating layers 32 and outer sidewalls of the memory stack structures 55. Specifically, the lanthanum oxide layer 44A is in direct contact with the front side silicon oxide blocking dielectric layer 52 and the aluminum oxide layer 44B is in direct contact with the molybdenum portions 46B.

In another embodiment, the backside blocking dielectric layer 44 comprises a layer stack of an aluminum oxide layer 44B and a zirconium oxide layer 44A. In this case, the zirconium oxide layer 44A is formed directly on the insulating layers 32 and outer sidewalls of the memory stack structures 55. Specifically, the zirconium oxide layer 44A is in direct contact with the front side silicon oxide blocking dielectric layer 52 and the aluminum oxide layer 44B is in direct contact with the molybdenum portions 46B.

Figure 9E:
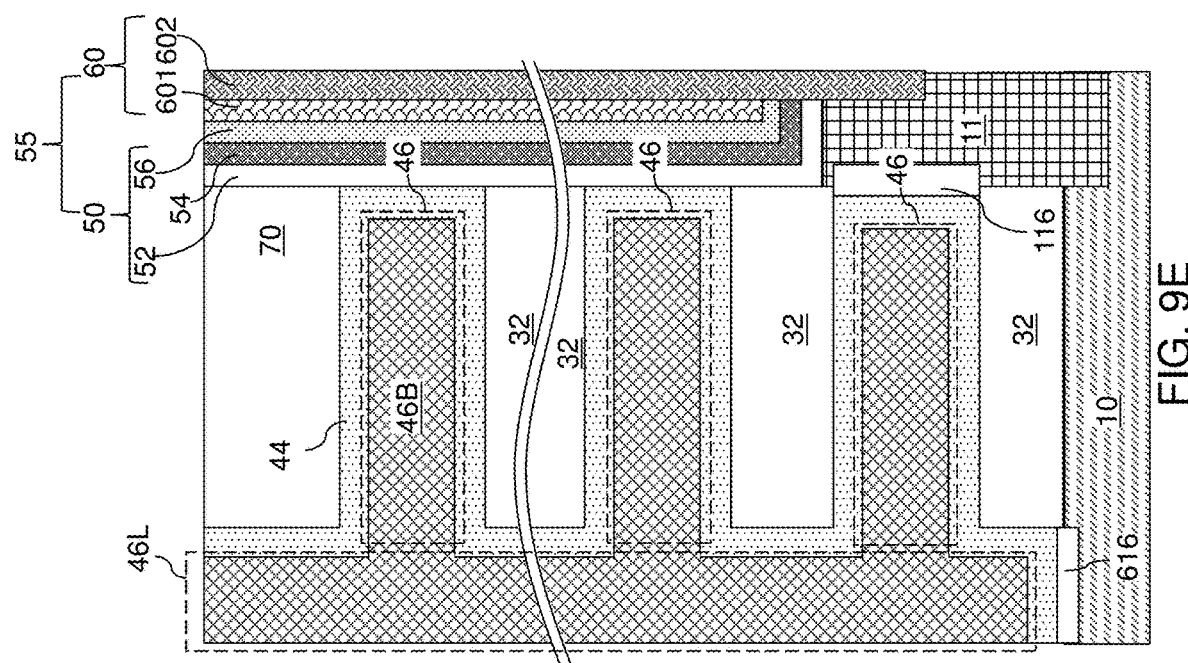
FIG. 9E is a vertical cross-sectional view of an alternative configuration of the region of the exemplary structure including electrically conductive layers according to an embodiment of the present disclosure.
Figure 10:
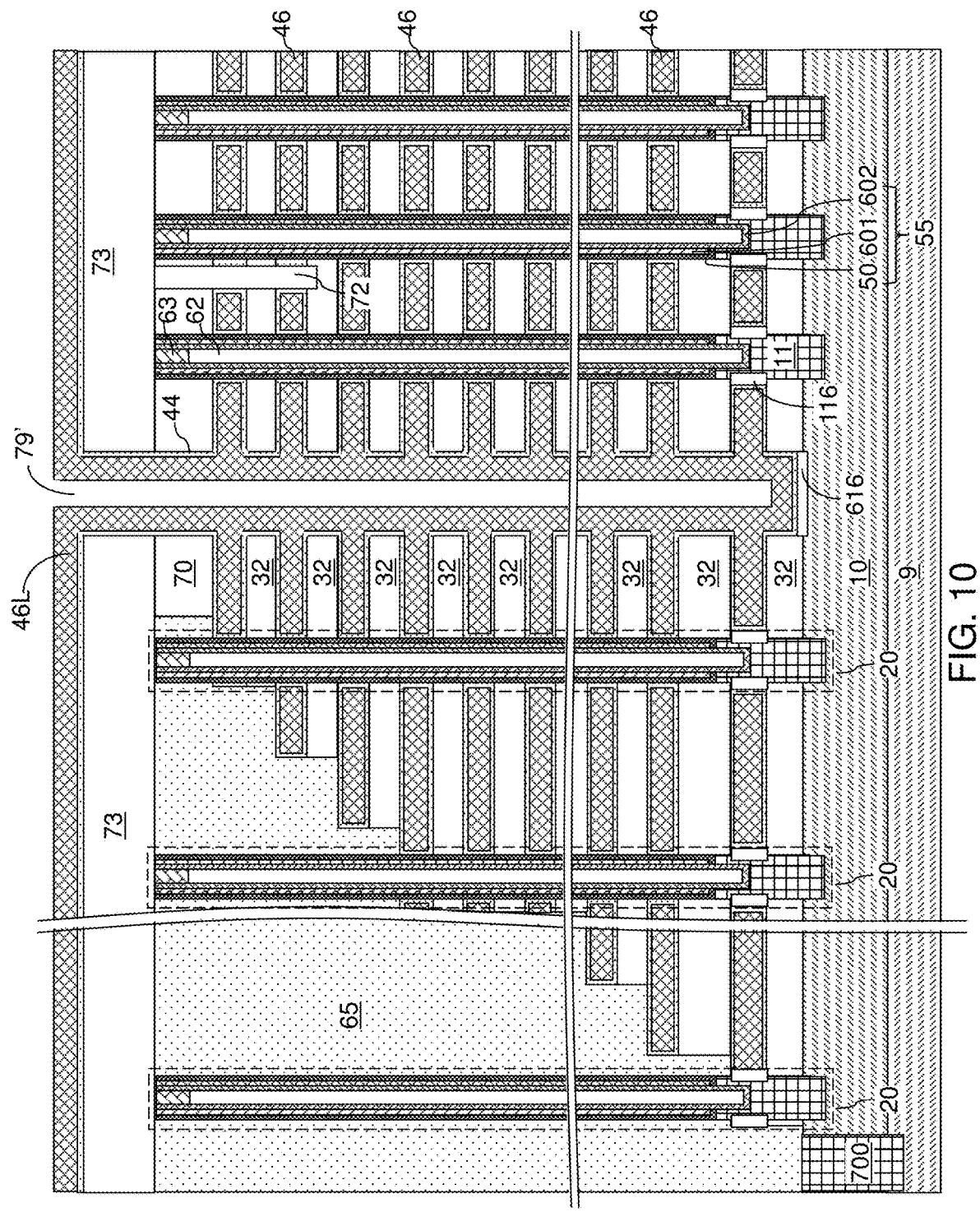
FIG. 10 is a schematic vertical cross-sectional view of the exemplary structure at the processing step of FIG. 9D or 9E.

Referring to FIG. 9D and 10, molybdenum is deposited in the plurality of backside recesses 43, on the sidewalls of the at least one the backside trench 79, and over the top surface of the contact level dielectric layer 73 to form a molybdenum layer 46B. Molybdenum has a bulk resistivity of about 5.34 $\Omega$Ohm-cm, which is comparable with the bulk resistivity of tungsten of about 5.28 $\Omega$Ohm-cm.

Deposition of the molybdenum-containing material can be performed by chemical vapor deposition (CVD) or atomic layer deposition (ALD). Chemical vapor deposition or atomic layer deposition of the molybdenum-containing material employs a molybdenum-containing precursor that can be easily vaporized to leave a high-purity molybdenum-containing material on a surface without causing surface damage. In one embodiment, an organometallic compound with relatively high vapor pressures and good thermal stability can be employed as the molybdenum-containing precursor gas to deposit molybdenum-containing without requiring hydrogen. In another embodiment $MoCl_6$ or $MoF_6$ can be employed as a molybdenum-containing precursor gas in a CVD or ALD process. In case $MoCl_6$ or $MoF_6$ is employed as the molybdenum-containing precursor gas, hydrogen or a hydride gas can be employed as the reduction gas. Hydride gases that can be employed to reduce $MoCl_6$ or $MoF_6$ include silane, disilane, diborane, ethylene, and acetylene. A deposition process employing the combination of the molybdenum-containing precursor gas (such as $MoCl_6$ or $MoF_6$) and a reduction gas (such as hydrogen or a hydride gas) can deposit a molybdenum-containing material consisting essentially of molybdenum. For example, the molybdenum-containing material can include molybdenum atoms with an atomic concentration greater than 99.5%. The molybdenum-containing material nucleates directly on the dielectric surfaces of the backside blocking dielectric layer 44 (e.g., surfaces of the aluminum oxide layer 44B) after an incubation time, which is the time delay between the commencement of the flow of the reactant and the reduction gas and beginning of deposition of molybdenum. Typically, the incubation time may be in a range from 1 second to 20 seconds depending on deposition conditions.

The inventors of the present disclosure demonstrated growth of molybdenum directly on surfaces of an aluminum oxide layer without use of any electrically conductive diffusion barrier or nucleation layer. Molybdenum can be isotropically grown from surfaces of aluminum oxide without employing an electrically conductive diffusion barrier layer such as a metal nitride layer (e.g., a TiN, TaN, etc.), or a combination of a metal and a metal nitride layer (e.g., Ti/TiN, Ta, TiN, etc.). Thus, no electrically conductive diffusion barrier layer is present between the molybdenum portions 46B and the backside blocking dielectric layer 44. The size of molybdenum grains within the molybdenum layer 46B can be on the order of the height of the backside recesses after a subsequent anneal process. The grain size within the molybdenum layer 46B is discussed below, with respect to FIGS. 15 and 16.

The duration of the molybdenum deposition process can be selected such that the molybdenum layer 46B completely fill the backside recesses 43. The molybdenum layer 46B can be formed as a continuous material layer including electrically conductive layers 46 that fill the backside recesses 43 and a continuous molybdenum layer 46L located over the contact level dielectric layer 73 and including vertically extending portions located at sidewalls of the backside trenches 79. A center region of each backside trench 79 may not be filled with the continuous molybdenum layer 46L. Thus, a backside cavity 79' is present within each backside trench 79.

A plurality of electrically conductive layers 46 can be formed in the plurality of backside recesses 43, and a continuous molybdenum layer 46L can be formed on the sidewalls of each backside trench 79 and over the contact level dielectric layer 73. Each electrically conductive layer 46 can consist of a respective molybdenum layer 46B. Each sacrificial material layer 42 can be replaced with an electrically conductive layer 46. A backside cavity 79' can be present in the portion of each backside trench 79 that is not filled with the backside blocking dielectric layer 44 and the continuous molybdenum layer 46L. A tubular dielectric spacer 116 laterally surrounds each pedestal channel portion 11. A bottommost electrically conductive layer 46 laterally surrounds each tubular dielectric spacer 116 upon formation of the electrically conductive layers 46.

The processing steps of FIGS. 9D and 10 form electrically conductive layers 46 including molybdenum portions by depositing the molybdenum portions directly on surfaces of the backside blocking dielectric layer 44 in remaining volumes of the backside recesses 43. The molybdenum portions are vertically spaced from the insulating layers 32 by horizontal portions of the backside blocking dielectric layer 44, and are laterally spaced from the memory stack structures 55 by vertical portions of the backside blocking dielectric layer 44. The molybdenum portions are formed by a conformal deposition process that deposits material portions consisting essentially of molybdenum. In one embodiment, all volumes of the backside recesses 43 can be completely filled with the backside blocking dielectric layer 44 and the molybdenum portions that comprise the molybdenum layers 46B. In another embodiment, all volumes of the backside recesses 43 can be at least partially completely filled with the backside blocking dielectric layer 44 and the molybdenum portions that comprise the molybdenum layers 46B.

Referring to FIG. 9E, an alternative configuration of the exemplary structure is illustrated, which is derived from the exemplary structure by forming a single aluminum oxide containing layer as the backside blocking dielectric layer 44 in lieu of a stack of a first backside blocking dielectric layer 44A and a second backside blocking dielectric layer 44B. In one embodiment, the backside blocking dielectric layer 44 can consist of a composite dielectric selected from an aluminum lanthanum oxide layer, an aluminum zirconium oxide layer, or an aluminum lanthanum zirconium oxide layer in direct contact with the molybdenum portions 46B, the insulating layers 32, and outer sidewalls of the memory stack structures 55 (i.e., with the front side blocking dielectric layer 52). In this case, the backside blocking dielectric layer 44 can be formed by a conformal deposition process such as atomic layer deposition (ALD) as a composite dielectric or as separate sublayers (44A, 44B) followed by annealing to interdiffuse the sublayers to form the composite dielectric. The thickness of the backside blocking dielectric layer 44 can be in a range from 1 nm to 15 nm, such as 2 nm to 6 nm, although lesser and greater thicknesses can also be employed.

Figure 11A:
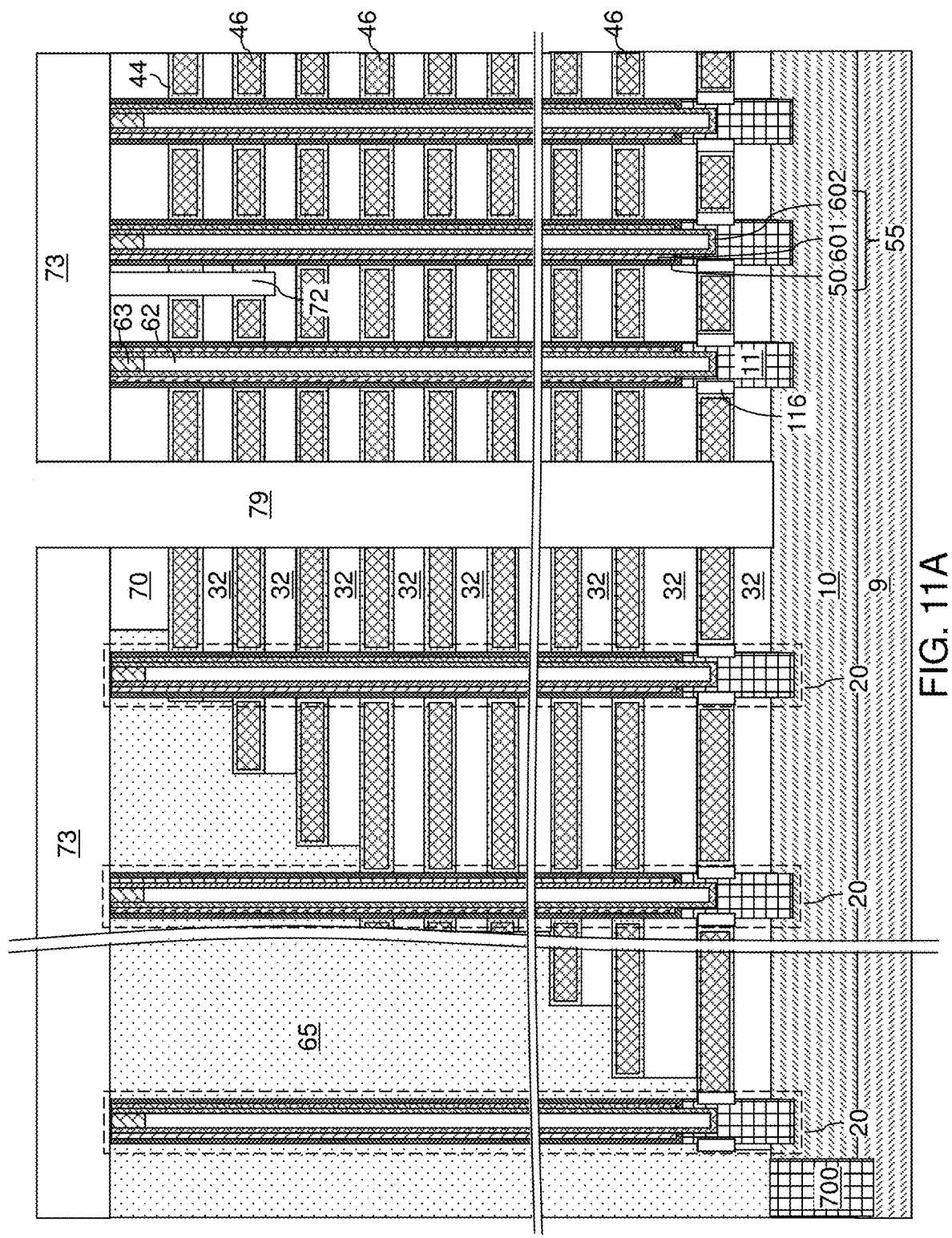
FIG. 11A is a schematic vertical cross-sectional view of the exemplary structure after removal of a deposited conductive material from within the backside trench according to an embodiment of the present disclosure.
Figure 11B:
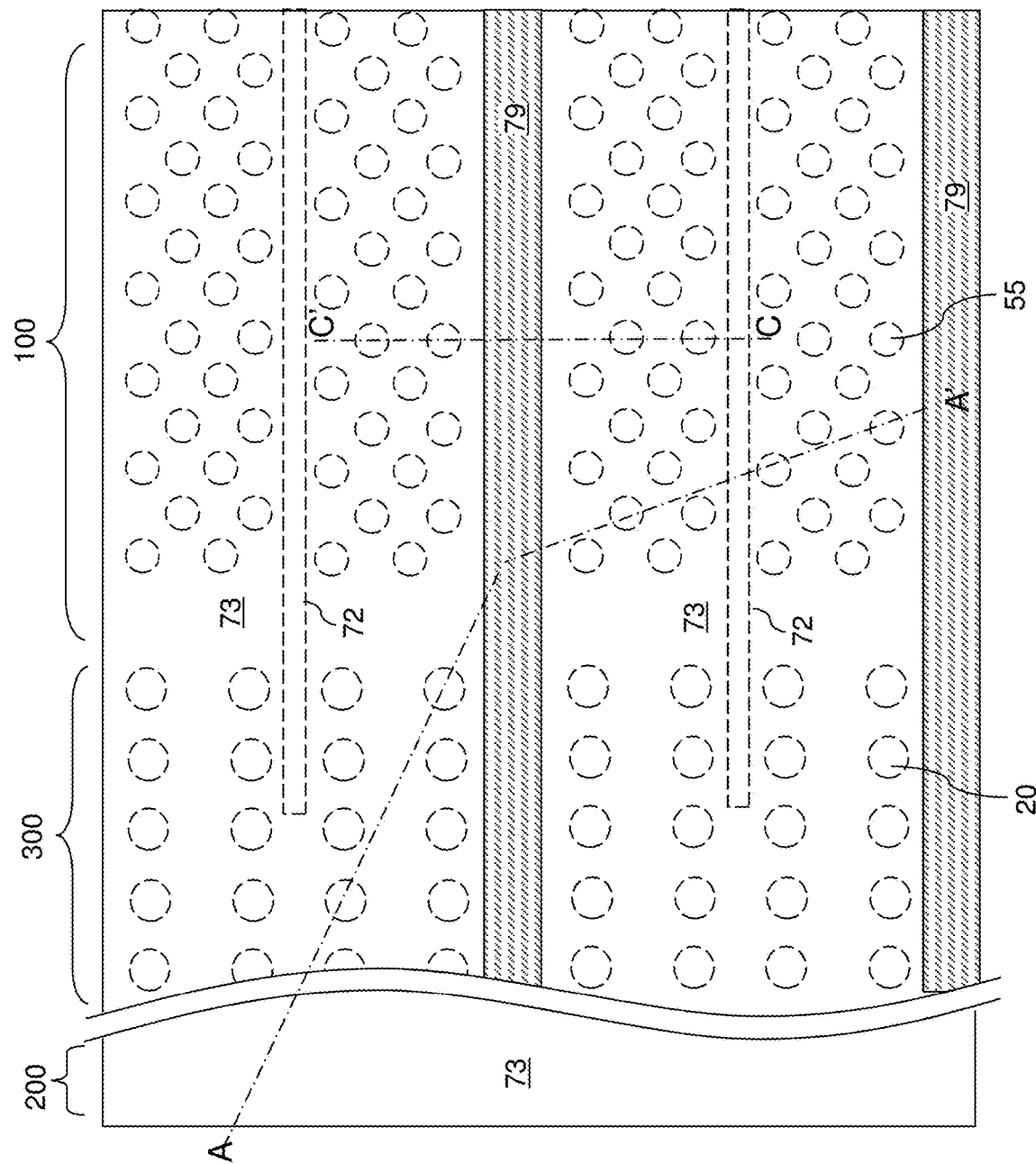
FIG. 11B is a top-down view of the exemplary structure of FIG. 11A. The hinged vertical plane A-A' is the plane of the vertical cross-sectional view of FIG. 11A.
Figure 11C:
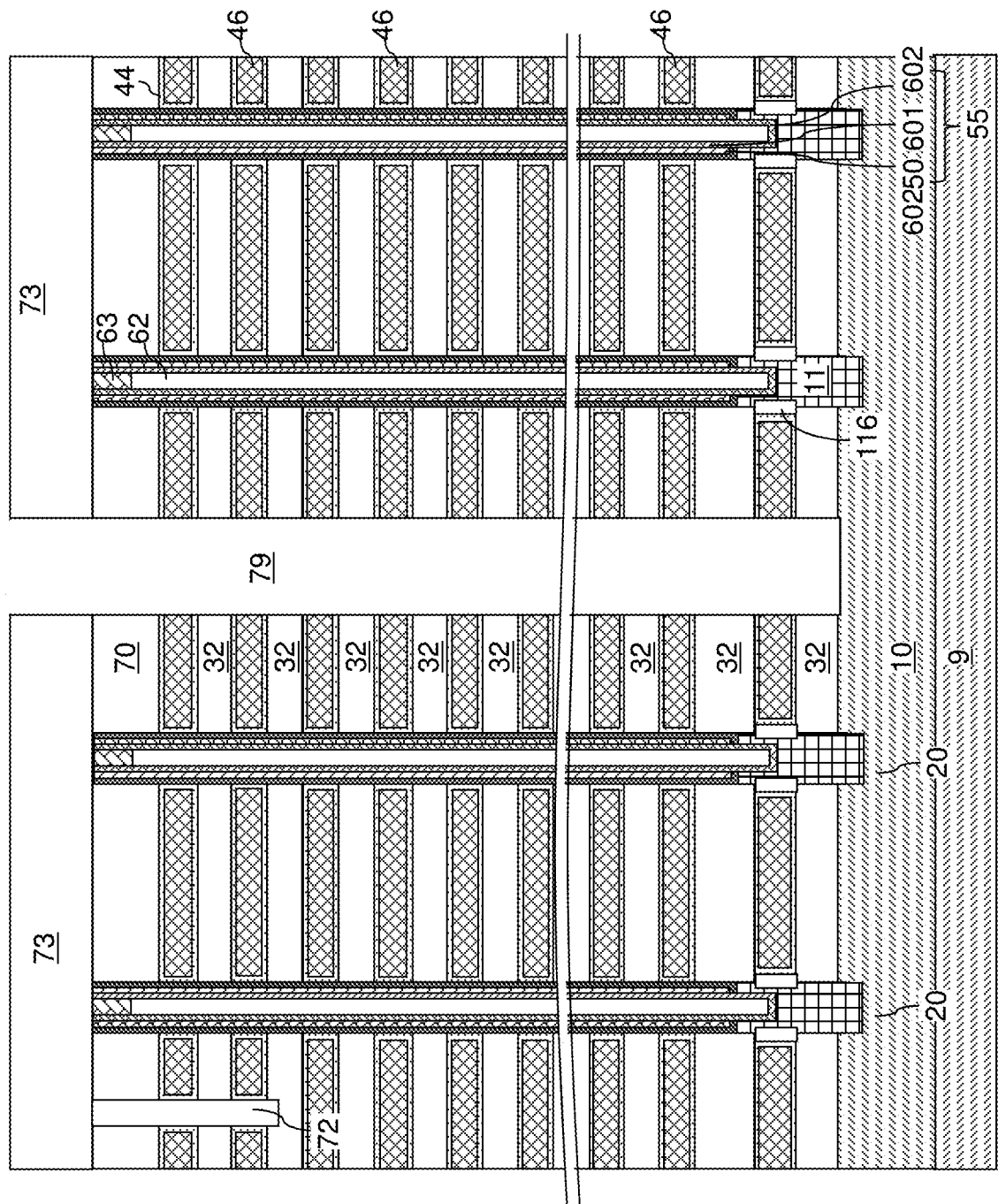
FIG. 11C is a vertical cross-sectional view along the vertical plane C-C' of FIG. 11B.

Referring to FIGS. 11A-11C, the deposited metallic material of the continuous molybdenum layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous molybdenum layer 46L can be selective to the material of the backside blocking dielectric layer 44. In this case, a horizontal portion of the backside blocking dielectric layer 44 can be present at the bottom of each backside trench 79. In another embodiment, the removal of the continuous molybdenum layer 46L may not be selective to the material of the backside blocking dielectric layer 44 or, the backside blocking dielectric layer 44 may not be employed. The planar dielectric portions 616 can be removed during removal of the continuous molybdenum layer 46L.

Figure 12A:
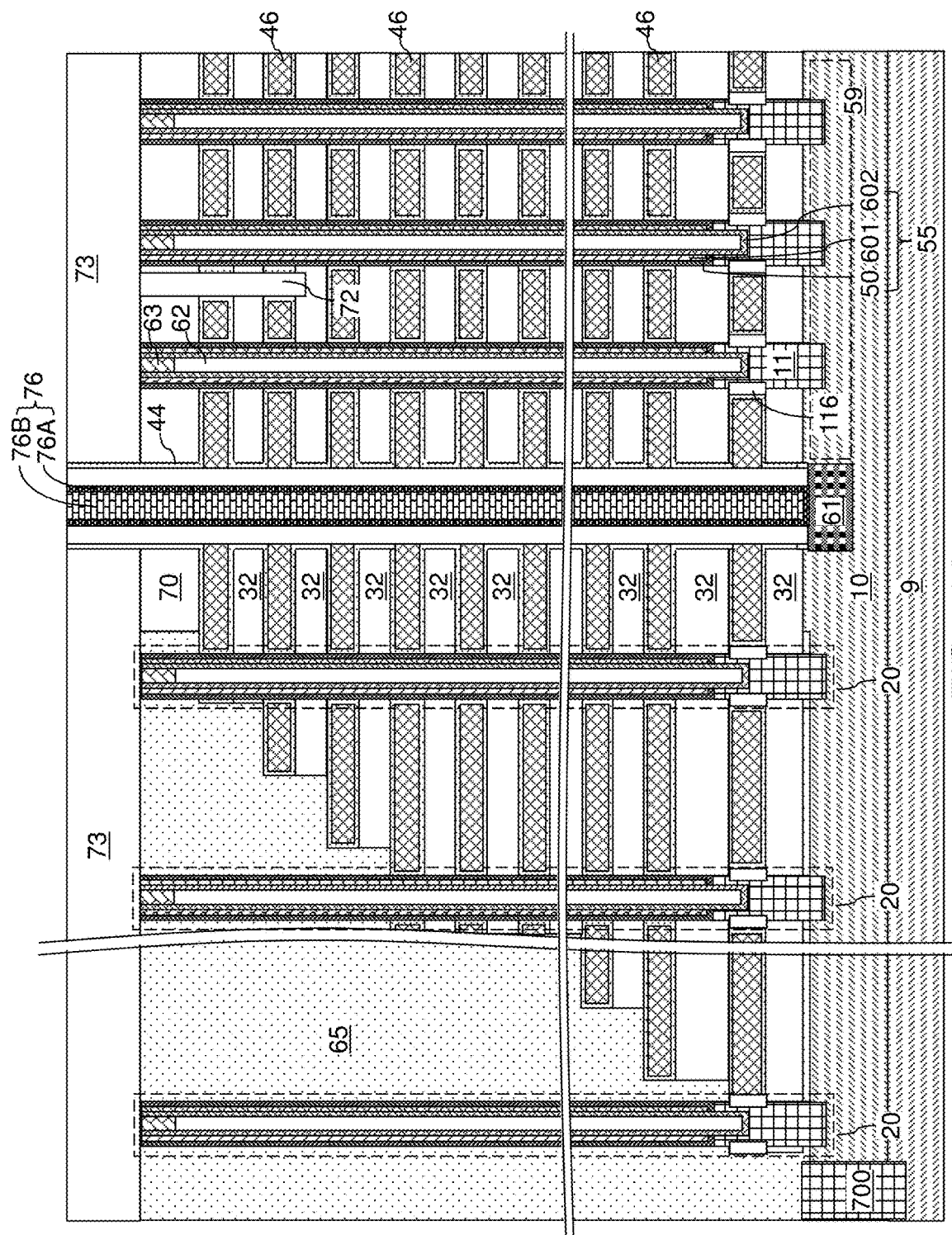
FIG. 12A is a schematic vertical cross-sectional view of the exemplary structure after formation of an insulating spacer and a backside contact structure according to an embodiment of the present disclosure.
Figure 12B:
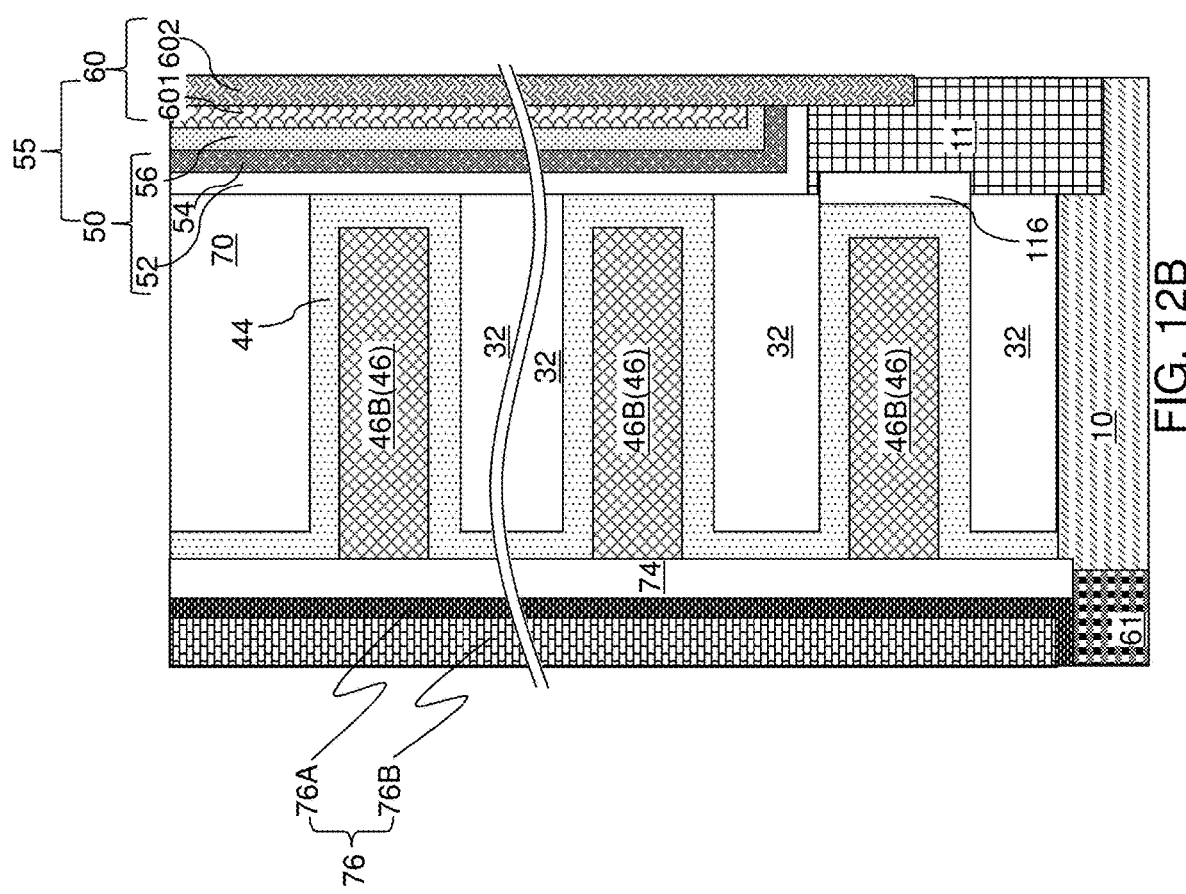
FIG. 12B is a magnified view of a region of the exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present in each backside trench 79, the insulating material layer can be formed directly on surfaces of the backside blocking dielectric layer 44 and directly on the sidewalls of the electrically conductive layers 46. If a backside blocking dielectric layer 44 is not present in the backside trenches 79, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. Each insulating spacer 74 is a dielectric wall structure that provides dielectric isolation between neighboring pairs of alternating stacks (32, 46). Each dielectric wall structure (which comprises an insulating spacer 74) can be formed in a backside trench 79 directly on sidewalls of a respective set of molybdenum portions (which comprises a set of molybdenum layers 46B). A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
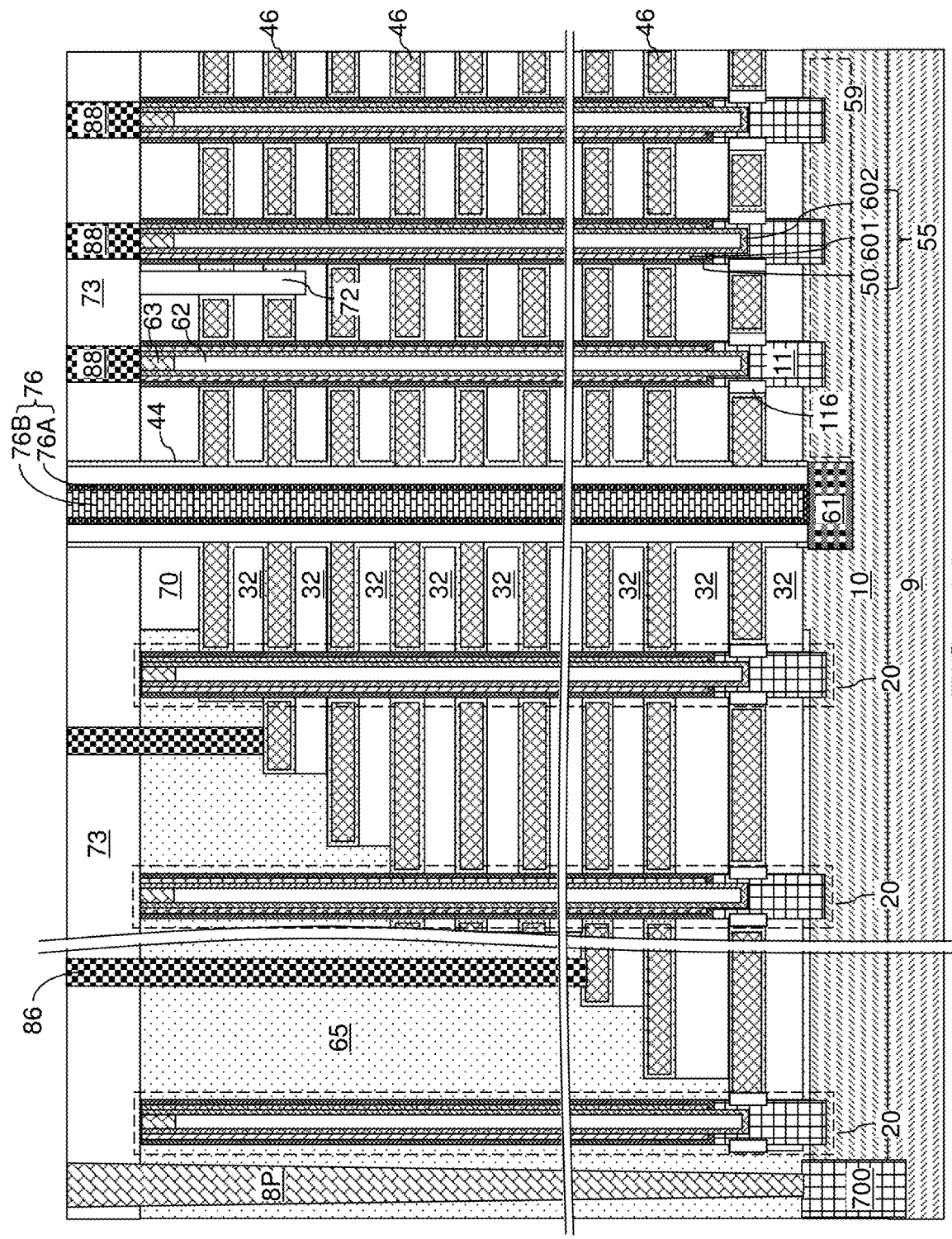
FIG. 13A is a schematic vertical cross-sectional view of the exemplary structure after formation of additional contact via structures according to an embodiment of the present disclosure.
Figure 13B:
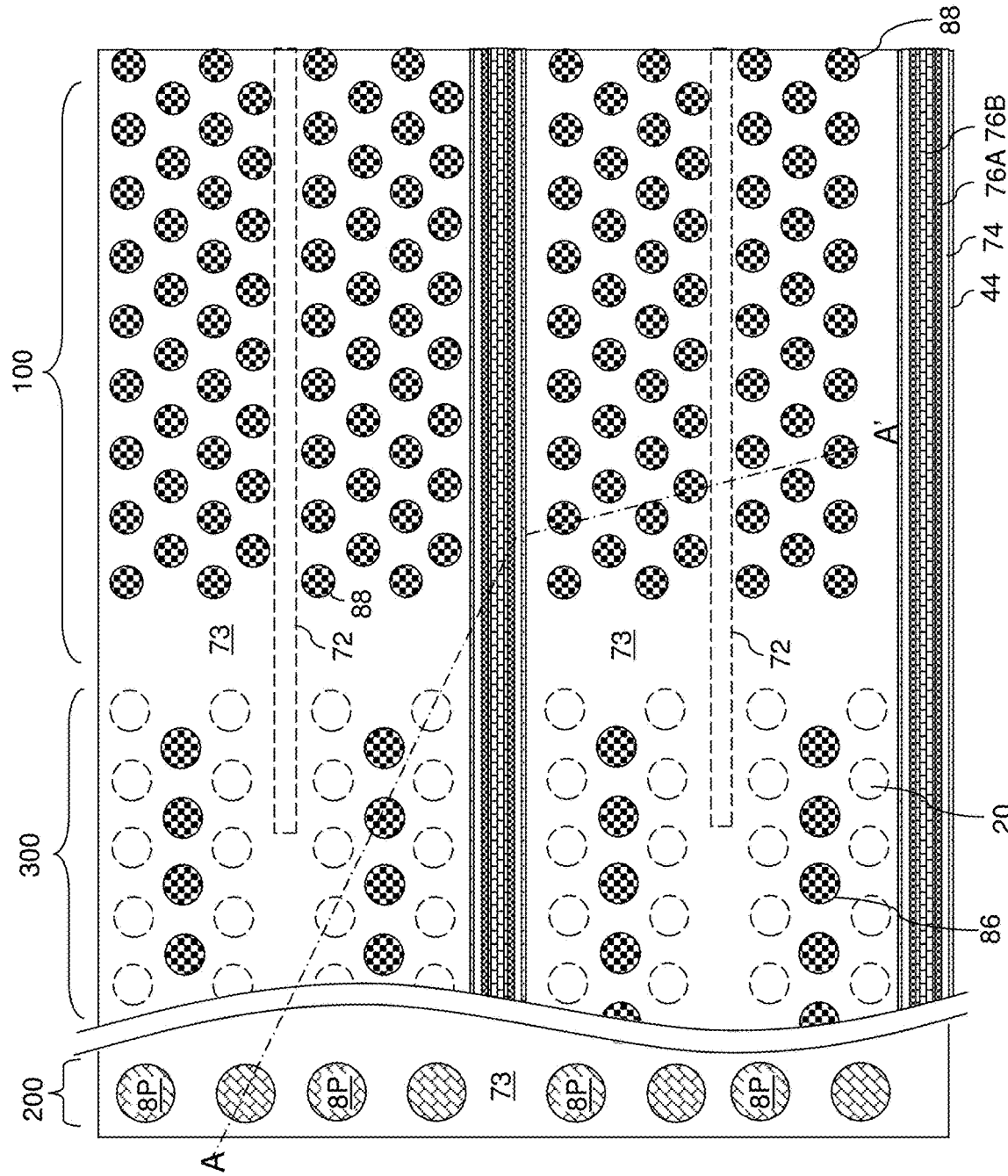
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

FIGS. 14A-14E illustrate various configurations of the interface between the backside blocking dielectric layer 44 and the front side blocking dielectric layer 52 comprising silicon oxide ($SiO_2$).

Figure 14C:
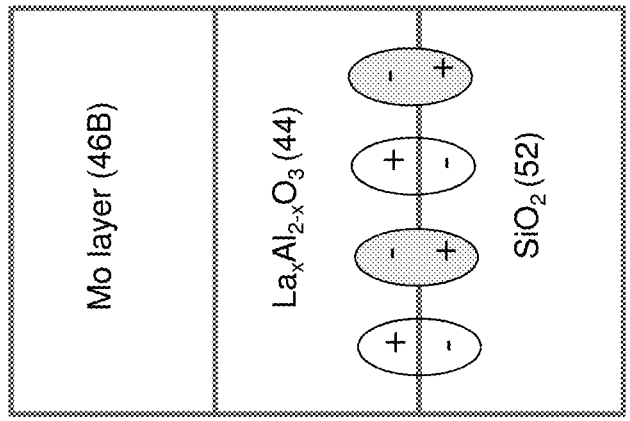
FIGS. 14A-14E are schematic views of various configurations of the exemplary structure of the present disclosure.
Figure 14B:
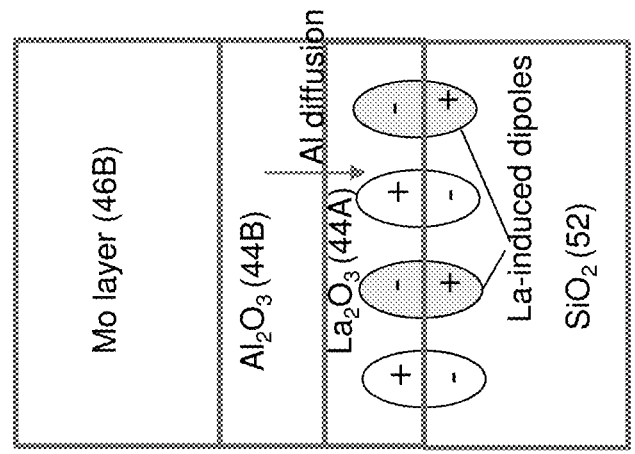
Figure 14A:
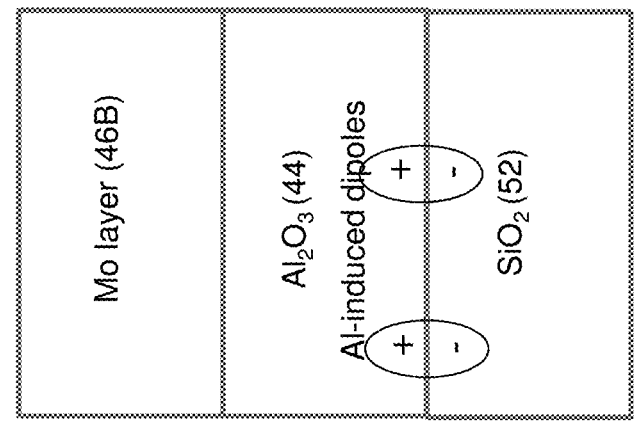

FIG. 14A illustrates a first configuration for the backside blocking dielectric layer 44. In the first configuration, the backside blocking dielectric layer 44 consists of aluminum oxide, and the outermost sublayer of the blocking dielectric layer 52 or the entirety of the blocking dielectric layer 52 consists of silicon oxide. The dipole moment generated at the interface between the blocking dielectric layer 52 and the backside blocking dielectric layer 44 points toward the backside blocking dielectric layer 44. In other words, negative charges accumulate on the side of the blocking dielectric layer 52 and positive charges accumulate on the side of the backside blocking dielectric layer 44. A molybdenum layer 46B is formed directly on the aluminum oxide material of the backside blocking dielectric layer 44.

FIG. 14B illustrates a second configuration for the backside blocking dielectric layer 44 according to an embodiment of the present disclosure. In the second configuration, the backside blocking dielectric layer 44 is formed as a layer stack of a first backside blocking dielectric sublayer 44A including lanthanum oxide and a second backside blocking dielectric layer 44B including aluminum oxide at the processing steps of FIGS. 9B and 9C. Thermal processes performed between the processing steps of FIG. 9D and the processing steps of FIGS. 13A and 13B or after the processing steps of FIGS. 13A and 13B can induce diffusion of aluminum into the lanthanum oxide layer to provide a lanthanum oxide layer that is doped with aluminum oxide (i.e., a layer including predominantly lanthanum oxide and including aluminum as dopants in oxidized states) as the first backside blocking dielectric sublayer 44A. A molybdenum layer 46B is formed directly on the aluminum oxide material (e.g., sublayer 44A) of the backside blocking dielectric layer 44.

The dipole moment generated between lanthanum oxide and silicon oxide points toward silicon oxide. In other words, the dipole moment generated between lanthanum oxide and silicon oxide induces positive charges on the side of silicon oxide and induces negative charges on the side of aluminum oxide. The dipole moment generated between lanthanum oxide and silicon oxide mitigates (e.g., wholly or partially cancels) the dipole moment generated between aluminum oxide and silicon oxide. Thus, the overall electrical charge at the interface between the blocking dielectric layer 52 and the backside blocking dielectric layer 44 in the second configuration is less than the electrical charge at the interface between the blocking dielectric layer 52 and the backside blocking dielectric layer 44 in the first configuration of FIG. 14A. Reduction of the net dipole moment and net dipole-induced electrical charges at the interface between the blocking dielectric layer 52 and the backside blocking dielectric layer 44 enhances response of the vertical semiconductor channels 60 to the bias voltages applied to the electrically conductive layers 46. Further, lanthanum oxide has a dielectric constant of about 27, which is higher than the dielectric constant of aluminum oxide that is about 11. The increased dielectric constant of the backside blocking dielectric layer 44 of the second configuration over the dielectric constant provided in the first configuration can improve performance of the charge storage vertical transistors including the vertical semiconductor channels 60.

FIG. 14C illustrates a third configuration for the backside blocking dielectric layer 44 according to an embodiment of the present disclosure shown in FIG. 9E. In the third configuration, the backside blocking dielectric layer 44 includes, and consists of, an aluminum lanthanum oxide layer having a homogeneous composition or a graded composition. Thermal processes performed between the processing steps of FIG. 9E and the processing steps of FIGS. 13A and 13B or after the processing steps of FIGS. 13A and 13B can induce diffusion between lanthanum oxide and aluminum oxide layer to provide a composite of the second backside blocking dielectric sublayer 44B and the first backside blocking dielectric sublayer 44A. The backside blocking dielectric layer 44 includes composite layer of aluminum oxide and lanthanum oxide, which includes 5 to 20 atomic percent, such as 10 to 15 atomic percent lanthanum oxide, and greater than 50 atomic percent, such as remainder, aluminum oxide. The gradient in material composition (or the complete homogeneity of composition) in the backside blocking dielectric layer 44 is determined by the thermal cycling performed after the processing steps of FIG. 9E. Alternatively, the backside blocking dielectric layer 44 can be deposited as a composite layer rather than being deposited as separate sublayers followed by annealing to interdiffuse the sublayers. In one embodiment, the atomic concentration of lanthanum atoms at the interface between the homogenous or graded backside blocking dielectric layer 44 and the silicon oxide material of the blocking dielectric layer 52 can be selected that the net dipole moment at the interface is substantially zero. In one embodiment, the ratio of atomic concentrations for aluminum and lanthanum can be approximately 9:1 at the interface between the homogenous or graded backside blocking dielectric layer 44 and the silicon oxide material of the blocking dielectric layer 52, thereby providing a near-zero net dipole moment at the interface.

Figure 14E:
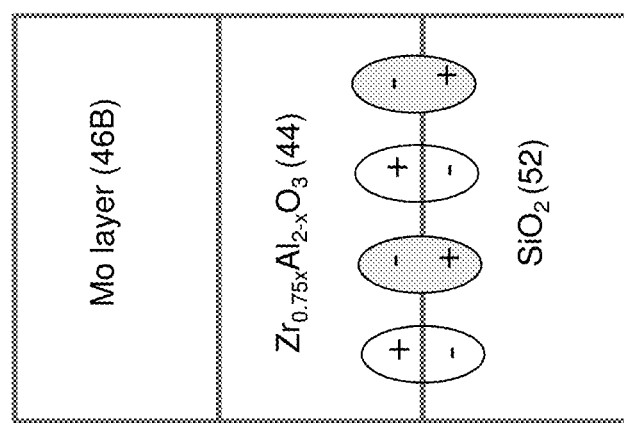
Figure 14D:
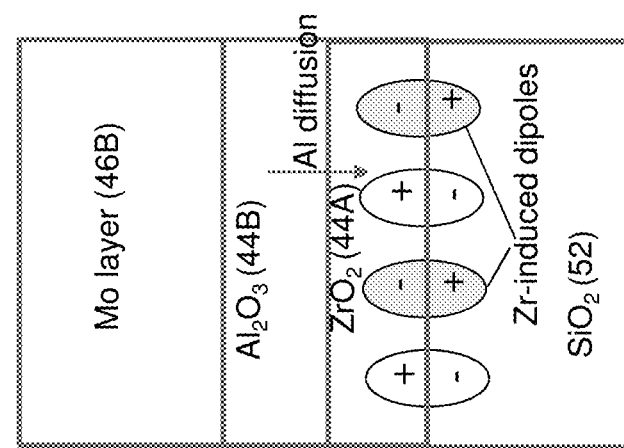

FIG. 14D illustrates a fourth configuration for the backside blocking dielectric layer 44 according to an embodiment of the present disclosure. In the fourth configuration, the backside blocking dielectric layer 44 is formed as a layer stack of a first backside blocking dielectric sublayer 44A including zirconium oxide and a second backside blocking dielectric layer 44B including aluminum oxide at the processing steps of FIGS. 9B and 9C. Thermal processes performed between the processing steps of FIG. 9D and the processing steps of FIGS. 13A and 13B or after the processing steps of FIGS. 13A and 13B can induce diffusion of aluminum into the zirconium oxide layer to provide a zirconium oxide layer that is doped with aluminum oxide (i.e., a layer including predominantly zirconium oxide and including aluminum as dopants in oxidized states) as the first backside blocking dielectric sublayer 44A. A molybdenum layer 46B is formed directly on the aluminum oxide sublayer 44B of the backside blocking dielectric layer 44.

The dipole moment generated between zirconium oxide and silicon oxide points toward silicon oxide. In other words, the dipole moment generated between zirconium oxide and silicon oxide induces positive charges on the side of silicon oxide and induces negative charges on the side of zirconium oxide. The dipole moment generated between zirconium oxide and silicon oxide mitigates (e.g., wholly or partially cancels) the dipole moment generated between aluminum oxide and silicon oxide. Thus, the overall electrical charge at the interface between the blocking dielectric layer 52 and the backside blocking dielectric layer 44 in the second configuration is less than the electrical charge at the interface between the blocking dielectric layer 52 and the backside blocking dielectric layer 44 in the first configuration of FIG. 14A. Reduction of the net dipole moment and net dipole-induced electrical charges at the interface between the blocking dielectric layer 52 and the backside blocking dielectric layer 44 enhances response of the vertical semiconductor channels 60 to the bias voltages applied to the electrically conductive layers 46.

FIG. 14E illustrates a fifth configuration for the backside blocking dielectric layer 44 according to an embodiment of the present disclosure shown in FIG. 9E. In the fifth configuration, the backside blocking dielectric layer 44 includes, and consists of, an aluminum zirconium oxide layer having a homogeneous composition or a graded composition. Thermal processes performed between the processing steps of FIG. 9E and the processing steps of FIGS. 13A and 13B or after the processing steps of FIGS. 13A and 13B can induce diffusion of zirconium into the aluminum oxide layer to provide a composite layer of the second backside blocking dielectric sublayer 44B and the first backside blocking dielectric sublayer 44A. The backside blocking dielectric layer 44 includes a composite layer of aluminum oxide and zirconium oxide, which includes 5 to 20 atomic percent, such as 10 to 15 atomic percent zirconium oxide, and greater than 50 atomic percent, such as remainder, aluminum oxide. The gradient in material composition (or the complete homogeneity of composition) in the backside blocking dielectric layer 44 is determined by the thermal cycling performed after the processing steps of FIG. 9D. In one embodiment, the atomic concentration of zirconium atoms at the interface between the homogenous or graded backside blocking dielectric layer 44 and the silicon oxide material of the blocking dielectric layer 52 can be selected that the net dipole moment at the interface is substantially zero. Alternatively, the backside blocking dielectric layer 44 can be deposited as a composite layer rather than being deposited as separate sublayers followed by annealing to interdiffuse the sublayers. In one embodiment, the ratio of atomic concentrations for aluminum and zirconium can be approximately 9:1 at the interface between the homogenous or graded backside blocking dielectric layer 44 and the silicon oxide material of the blocking dielectric layer 52, thereby providing a near-zero net dipole moment at the interface.

Figure 15:
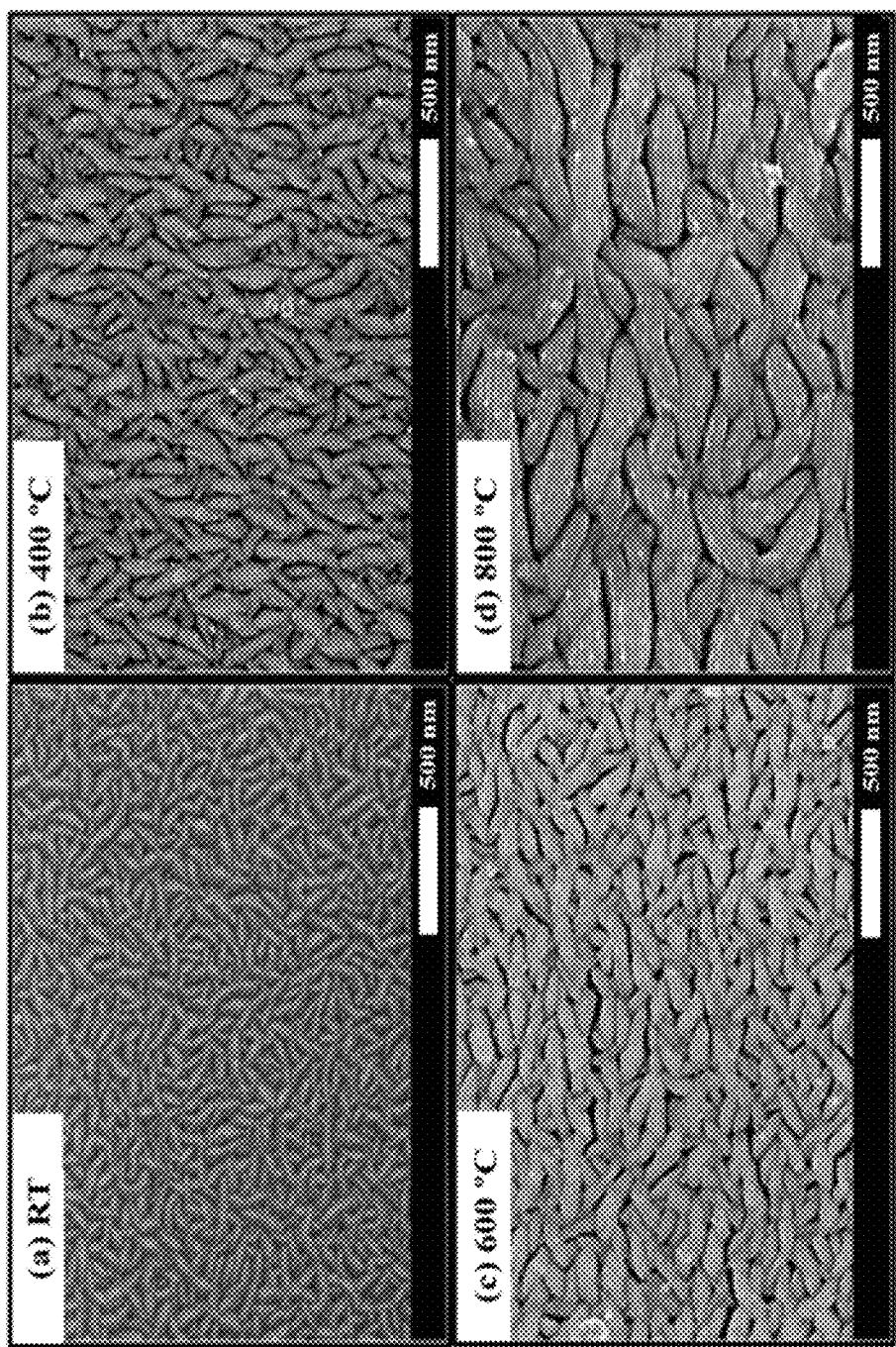
FIG. 15 are various scanning electron micrographs (SEM's) of molybdenum films formed on an aluminum oxide-based underlying layer.
Figure 16:
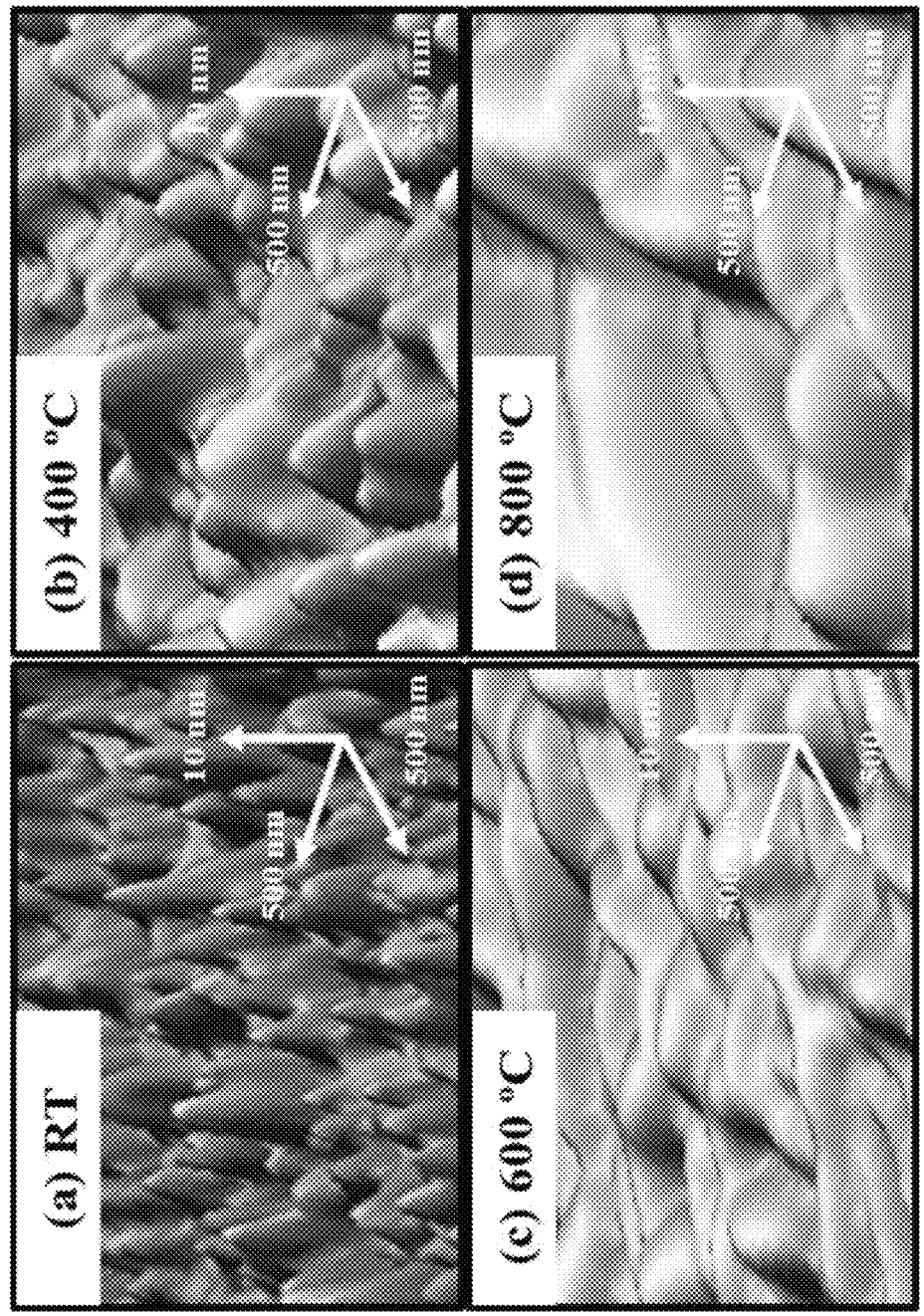
FIG. 16 are various atomic force micrographs (AFM's) of molybdenum films formed on an aluminum oxide-based underlying layer.

Grain size of the polycrystalline molybdenum material in the molybdenum layers 46B can grow upon anneal processes that are performed after the processing steps of FIG. 9D or after the processing steps of FIG. 9E. FIG. 15 illustrates various scanning electron microscopy micrographs (SEM's) of molybdenum films formed on an aluminum oxide-based underlying layer. Significant grain growth occurs as the temperature of the film is raised from room temperature RT (e.g., 25 degrees Celsius) to 400 degrees Celsius, to 600 degrees Celsius, and then to 800 degrees Celsius. FIG. 16 shows various atomic force microscopy micrographs (AFM's) of molybdenum films formed on the aluminum oxide-based underlying layer at the various stages corresponding to the four SEM's of FIG. 15.

Referring to all drawings and according to various embodiments of the present disclosure, a three-dimensional memory device includes an alternating stack of insulating layers 32 and electrically conductive layers 46 containing molybdenum portions 46B located over a substrate (9, 10), memory stack structures 55 extending through the alternating stack, and including a memory film 50 and a vertical semiconductor channel 60, and a backside blocking dielectric layer 44 of a dielectric oxide material including aluminum atoms and at least one of lanthanum or zirconium atoms which directly contacts the molybdenum portions 46B.

In one embodiment, the molybdenum portions 46 are in direct contact with surfaces of the backside blocking dielectric layer 44, are vertically spaced from the insulating layers 32 by horizontal portions of the backside blocking dielectric layer 44, and are laterally spaced from the memory stack structures 55 by vertical portions of the backside blocking dielectric layer 44.

In one embodiment, the molybdenum portions consist essentially of molybdenum. In one embodiment, each of the electrically conductive layers 46 consists of a respective one of the molybdenum portions.

In one embodiment, the three-dimensional memory device comprises: a backside trench 79 vertically extending through each level of the alternating stack (32, 46) and extending to a top surface of the substrate (9, 10), and a dielectric wall structure 74 located in the backside trench 79, wherein each of the molybdenum portions 46B directly contacts a respective portion of a sidewall of the dielectric wall structure 74.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The silicon substrate can contain an integrated circuit comprising a driver circuit (comprising the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional N AND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (which comprise portions of the memory films 50, i.e., portions of the charge storage layer 54). Each charge storage element can be located adjacent to a respective one of the plurality of semiconductor channels (59, 11, 60).

The molybdenum portions (i.e., the molybdenum layers 46B) of the embodiments of the present disclosure are formed without a metallic liner directly on physically exposed surfaces of the backside blocking dielectric layer 44. Thus, a greater fraction of the volume of the backside recesses 43 can be employed to form the molybdenum portions as metal portions without forming metallic nitride barrier layers. Because molybdenum has a higher conductivity than the metallic nitride material layers at least by a factor of 10, the electrically conductive layers 46 of the embodiments of the present disclosure can provide a higher conductance (i.e., a lower resistance) than prior art electrically conductive layers employing metallic nitride liners. As a result, word line RC delay will be reduced, and consequently, the three-dimensional NAND memory device performance will be improved.

Further, including lanthanum and/or zirconium oxide in the aluminum oxide containing backside blocking dielectric 44 can reduce the dipole moment generated at the interface between the backside blocking dielectric layer 44 and the blocking dielectric layer 52. By eliminating or significantly reducing electrical charges induced by the net dipole moment at the interface, the vertical semiconductor channels 60 can be more responsive to the voltages applied to the electrically conductive layers 46 during programming, erasing, and reading, and provide faster device operation. As a result, the overall three-dimensional NAND memory device performance will improve.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate, wherein the electrically conductive layers comprise molybdenum portions;
   memory stack structures extending through the alternating stack, wherein each of the memory stack structures comprises a memory film and a vertical semiconductor channel; and
   a backside blocking dielectric layer comprising a dielectric oxide material including aluminum atoms and at least one of lanthanum or zirconium atoms, wherein the backside blocking dielectric layer is located between the electrically conductive layers and the memory stack structures and directly contacts the molybdenum portions,
   wherein each memory film comprises a tunneling dielectric, a charge storage layer, and a front side silicon oxide blocking dielectric layer which directly contacts the backside blocking dielectric layer, and further comprising an additional feature comprising:
      a first feature wherein the backside blocking dielectric includes aluminum oxide and at least one of lanthanum oxide or zirconium oxide which mitigates a dipole between the aluminum oxide and the front side silicon oxide blocking dielectric; or
      a second feature wherein the backside blocking dielectric layer comprises a layer stack of an aluminum oxide layer and a lanthanum oxide layer, wherein the lanthanum oxide layer is in direct contact with the front side silicon oxide blocking dielectric layer and the aluminum oxide layer is in direct contact with the molybdenum portions; or
      a third feature wherein the backside blocking dielectric layer comprises a layer stack of an aluminum oxide layer and a zirconium oxide layer, wherein the zirconium oxide layer is in direct contact with the front side silicon oxide blocking dielectric layer and the aluminum oxide layer is in direct contact with the molybdenum portions; or
      a fourth feature wherein the backside blocking dielectric layer comprises an aluminum lanthanum oxide layer in direct contact with the molybdenum portions; or
      a fifth feature wherein the backside blocking dielectric layer comprises an aluminum zirconium oxide layer in direct contact with the molybdenum portions.

2. The three-dimensional memory device of Claim 1, wherein the additional feature is the first feature.

3. The three-dimensional memory device of Claim 1, wherein the additional feature is the second feature.

4. The three-dimensional memory device of Claim 1, wherein the additional feature is the third feature.

5. The three-dimensional memory device of Claim 1, wherein the additional feature is the fourth feature.

6. The three-dimensional memory device of Claim 1, wherein the additional feature is the fifth feature.

7. The three-dimensional memory device of claim 1, wherein each of the electrically conductive layers comprise word lines which consist of only a respective one of the molybdenum portions.

8. The three-dimensional memory device of claim 1, further comprising:
    a backside trench vertically extending through each level of the alternating stack and extending to a top surface of the substrate; and
    a dielectric wall structure located in the backside trench, wherein each of the molybdenum portions directly contacts a respective portion of a sidewall of the dielectric wall structure.

9. The three-dimensional memory device of claim 1, wherein no electrically conductive diffusion barrier is present between the molybdenum portions and the backside blocking dielectric layer.

10. The three-dimensional memory device of claim 1, wherein:
    the backside blocking dielectric layer is located between the electrically conductive layers and a combination of the insulating layers and the memory stack structures; and
    the molybdenum portions are vertically spaced from the insulating layers by horizontal portions of the backside blocking dielectric layer, and laterally spaced from the memory stack structures by vertical portions of the backside blocking dielectric layer.

11. The three-dimensional memory device of claim 1, wherein:
    the three-dimensional memory device comprises a monolithic three-dimensional NAND memory device;
    the electrically conductive layers comprise, or are electrically connected to, a respective word line of the monolithic three-dimensional NAND memory device;
    the semiconductor substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the electrically conductive layers comprise a plurality of control gate electrodes having a strip shape extending substantially parallel to the top surface of the substrate; and
    the array of monolithic three-dimensional NAND strings comprises:
        a plurality of semiconductor channels, wherein at least one end portion of each of the plurality of semiconductor channels extends substantially perpendicular to a top surface of the substrate, and
        a plurality of charge storage elements, each charge storage element located adjacent to a respective one of the plurality of semiconductor channels.

12. A method of forming a three-dimensional memory device, comprising:
    forming an alternating stack of insulating layers and spacer material layers over a substrate;
    forming memory stack structures extending through the alternating stack, wherein each of the memory stack structures comprises a memory film and a vertical semiconductor channel;
    forming backside recesses by removing the sacrificial material layers selective to the insulating layers and the memory stack structures;
    forming a backside blocking dielectric layer comprising a dielectric oxide material including aluminum atoms and at least one of lanthanum or zirconium atoms directly on surfaces of the insulating layers and the memory stack structures in the backside recesses; and
    forming electrically conductive layers including molybdenum portions by depositing the molybdenum portions directly on surfaces of the backside blocking dielectric layer in remaining volumes of the backside recesses,
    wherein each memory film comprises a tunneling dielectric, a charge storage layer, and a front side silicon oxide blocking dielectric layer which directly contacts the backside blocking dielectric layer, and further comprising an additional feature comprising:
        a first feature wherein the backside blocking dielectric includes aluminum oxide and at least one of lanthanum oxide or zirconium oxide which mitigate a dipole between the aluminum oxide and the front side silicon oxide blocking dielectric; or
        a second feature wherein the backside blocking dielectric layer comprises a layer stack of an aluminum oxide layer and a lanthanum oxide layer, wherein the lanthanum oxide layer is in direct contact with the front side silicon oxide blocking dielectric layer and the aluminum oxide layer is in direct contact with the molybdenum portions; or
        a third feature wherein the backside blocking dielectric layer comprises a layer stack of an aluminum oxide layer and a zirconium oxide layer, wherein the zirconium oxide layer is in direct contact with the front side silicon oxide blocking dielectric layer and the aluminum oxide layer is in direct contact with the molybdenum portions; or
        a fourth feature wherein the backside blocking dielectric layer comprises an aluminum lanthanum oxide layer in direct contact with the molybdenum portions; or
        a fifth feature wherein the backside blocking dielectric layer comprises an aluminum zirconium oxide layer in direct contact with the molybdenum portions.

13. The method of claim 12, wherein:
    the molybdenum portions are formed by a conformal deposition process that deposits material portions consisting essentially of molybdenum; and
    all volumes of the backside recesses are partially or completely filled with the backside blocking dielectric layer and the molybdenum portions.

14. The method of Claim 12, wherein the additional feature is the first feature.

15. The method of Claim 12, wherein the additional feature is the second feature.

16. The method of Claim 12, wherein the additional feature is the third feature.

17. The method of Claim 12, wherein the additional feature is the fourth feature.

18. The method of Claim 12, wherein the additional feature is the fifth feature.

\* \* \* \* \*